(12) United States Patent
Song

(10) Patent No.: US 9,865,354 B1
(45) Date of Patent: Jan. 9, 2018

(54) EPROM DEVICE FOR STORING MULTI-BIT DATA AND READ CIRCUIT OF EPROM DEVICE

(71) Applicant: SK hynix Inc., Icheon-si, Gyeonggi-do (KR)

(72) Inventor: Hyun Min Song, Sejong (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/417,727

(22) Filed: Jan. 27, 2017

(30) Foreign Application Priority Data

Jul. 5, 2016 (KR) .......................... 10-2016-0085041

(51) Int. Cl.
*G11C 16/12* (2006.01)
*G11C 16/24* (2006.01)
*G11C 16/26* (2006.01)

(52) U.S. Cl.
CPC .............. *G11C 16/12* (2013.01); *G11C 16/24* (2013.01); *G11C 16/26* (2013.01)

(58) Field of Classification Search
CPC ............ G11C 11/1653; G11C 11/1655; G11C 13/0023; G11C 13/0026; G11C 16/10; G11C 16/12; G11C 16/24; G11C 17/14; G11C 17/143; G11C 17/146; G11C 17/16; G11C 17/165; G11C 17/18
See application file for complete search history.

(56) References Cited

U.S. PATENT DOCUMENTS

| 6,671,040 B2 | 12/2003 | Fong et al. | |
| 7,426,142 B1 | 9/2008 | Stansell et al. | |
| 9,378,814 B2 * | 6/2016 | Siau ........................ | G11C 7/062 |
| 9,502,132 B2 * | 11/2016 | Jang ....................... | G11C 17/16 |

FOREIGN PATENT DOCUMENTS

KR     1020140011790 A     1/2014

* cited by examiner

*Primary Examiner* — Harry W Byrne
*Assistant Examiner* — R Lance Reidlinger
(74) *Attorney, Agent, or Firm* — William Park & Associates Ltd.

(57) ABSTRACT

An EPROM device may include a unit cell, a switching unit, a decoder, and a comparing unit. The unit cell may be disposed between a ground voltage terminal and a bit line coupled to a program voltage supply line. The switching unit may control an electrical coupling of the program voltage supply line and the unit cell according to input switching control signal. The decoder may generate a plurality of output signals according to an input of binary data. The comparing unit may compare each of a plurality of reference voltages with a bit lien voltage and generate a program mode output signal. The level shifter may receive at least one output signal of the output signals of the decoder and the program mode output signal, and may output the output signal of the decoder or the program mode output signal as the switching control signal.

23 Claims, 23 Drawing Sheets

FIG.4

| A | B | PROGRAM MODE(PM) | D0 | D1 | D2 | D3 |
|---|---|---|---|---|---|---|
| 0 | 0 | NON-PROGRAM MODE(PM0) | High | Low | Low | Low |
| 0 | 1 | FIRST PROGRAM MODE(PM1) | Low | High | Low | Low |
| 1 | 0 | SECOND PROGRAM MODE(PM2) | Low | Low | High | Low |
| 1 | 1 | THIRD PROGRAM MODE(PM3) | Low | Low | Low | High |

FIG.22

| PROGRAM MODE(PM) | D1 | D2 | D3 | CD |
|---|---|---|---|---|
| NON-PROGRAM MODE(PM0) (220I) | Low | Low | Low | 00 |
| FIRST PROGRAM MODE(PM1) (220P1) | High | Low | Low | 01 |
| SECOND PROGRAM MODE(PM2) (220P2) | High | High | Low | 10 |
| THIRD PROGRAM MODE(PM3) (220P3) | High | High | High | 11 |

# EPROM DEVICE FOR STORING MULTI-BIT DATA AND READ CIRCUIT OF EPROM DEVICE

CROSS-REFERENCE TO RELATED APPLICATION

The present application claims priority under 35 U.S.C 119(a) to Korean Application number 10-2016-0085041, filed on Jul. 5, 2016, which is herein incorporated by reference in its entirety.

BACKGROUND

1. Technical Field

Various embodiments of the present disclosure generally relate to a nonvolatile memory device, and, more particularly, to an EPROM device for storing multi-bit data and a read circuit of the EPROM device.

2. Related Art

Semiconductor memory devices are typically classified into random access memory (RAM) devices and read only memory (ROM) devices according to data volatility thereof. The RAM devices are volatile memory devices that require power to retain their data (e.g., binary information) and lose stored data when the power supply is interrupted. In contrast, the ROM devices can retain stored data even when the power supply is interrupted. ROM devices may also be classified into programmable ROM (PROM) devices and mask ROM devices according to its data input method (e.g., data program method). The PROM devices may be a form of ROM that can be programmed by customers (i.e., users) even after fabrications of the PROM devices have been completed. The Mask ROM devices may be programmed during the fabrications thereof using implantation masks manufactured on the basis of data requested by users. Examples of the PROM devices may include one-time PROM (OTPROM) devices, erasable PROM (EPROM) devices and electrically erasable PROM (EEPROM) devices. Once the EPROM devices are programmed, the programmed data of the EPROM devices cannot be electrically changed. The programmed data of the EPROM devices can be erased by a physical means such as UV irradiation.

Nonvolatile memory device such as the EPROM device may employ an NMOS transistor or a PMOS transistor as a cell transistor. If a PMOS transistor is used as the cell transistor of the nonvolatile memory device, the PMOS transistor may have a turn-off state as an initial state, and may have a turn-on state as a programmed state. A read operation of the PMOS transistor may be executed by sensing whether a program current flows through the PMOS transistor.

SUMMARY

An EPROM device may include a unit cell, a switching unit, a decoder, a comparing unit, and a level shifter. The unit cell may be disposed between a bit line, which is coupled to a power supply line of a program voltage, and a ground voltage terminal. The switching unit may be disposed between the bit line and the program voltage supply line, and may control an electrical coupling of the program voltage supply line and the unit cell according to a switching control signal. The decoder may generate a plurality of output signals according to an input of binary data. The comparing unit may be enabled by a part of output signals of the decoder. The comparing unit may compare each of a plurality of reference voltages and a bit lien voltage, and may generate a program mode output signal. The level shifter may receive at least one output signal of the output signals of the decoder and the program mode output signal, and may output the output signal of the decoder or the program mode output signal as the switching control signal.

An EPROM device according to an embodiment of the present disclosure may include a unit cell, a switching unit, a multiplexer, and a comparator. The unit cell may be disposed between a bit line, which is coupled to a power supply line of a program voltage, and a ground voltage terminal. The switching unit may be disposed between the bit line and the program voltage supply line, and may control an electrical coupling between the program voltage supply line and the unit cell according to a switching control signal. The multiplexer may selectively output a first reference voltage, a second reference voltage, and a third reference voltage according to an input of binary data. The comparator may compare an output signal of the multiplexer and the bit line, and generate the switching control signal.

An EPROM device according to an embodiment of the present disclosure may include a cell array, a controller, a switching unit, a decoder, a comparing unit, a level shifter, an OR gate, and a bit line voltage selection unit. The cell array may include unit cells that are disposed at an intersection of a plurality of bit lines coupled to a power supply line of a program voltage and constituting columns and a plurality of selection enable signal lines constituting rows. The controller may output selection enable signals for selecting a row in which a selected unit cell is included among the rows. The controller may output binary data according to a program mode. The controller may output bit line selection signals for selecting a column in which the selected unit cell is included among the columns. The switching unit may be disposed between the program voltage supply line and each of the bit lines, and may control an electrical coupling between the program voltage supply line and the unit cells coupled to each of the bit lines according to the switching control signal. The decoder may generate a plurality of output signals according to an input of the binary data. The comparing unit may be enabled by the output signals of the decoder. The comparing unit may compare each of the plurality of inputted reference voltages and the bit line voltage, and may generate a program mode output signal. The level shifter may receive at least one output signal among the output signals of the decoder and the program mode output signal, and output the output signal of the decoder or the program mode output signal. The OR gate may be disposed between the switching unit and the level shifter, and may receive one of the bit line selection signals and an output signal of the level shifter and generate the switching control signal. The bit line voltage selection unit may receive the bit line voltages of the bit lines, output a bit line voltage of the selected bit line among the bit line voltages in response to the bit line selection signals, and input the bit line voltage to the comparing unit.

An EPROM device according to an embodiment of the present disclosure may include a cell array, a controller, a switching unit, a multiplexer, a comparing unit, an OR gate, a bit line voltage selection unit. The cell array may include unit cells relatively disposed at intersections of a plurality of bit lines coupled to a power supply line of a program voltage supply line and constituting columns and a plurality of selection enable signal lines constituting rows. The controller may output selection enable signals for selecting a row in which a selected unit cell is included among the rows. The controller may output binary data according to a program mode. The controller may output bit line selection signals for selecting a column in which the selected unit cell is included among the columns. The switching unit may be disposed between the program voltage supply line and each of the bit lines, and may switch an electrical coupling between the program voltage supply line and the unit cells coupled to each of the bit lines according to an input switching control signal. The multiplexer may selectively output a first reference voltage, a second reference voltage, and a third reference voltage according to an input of the binary data. The comparing unit configured to generate an output signal according to a comparison result obtained by comparing the output signal of the multiplexer and the bit line voltage. The OR gate may be disposed between the switching unit and the comparator, and may receive one of the bit line selection signals and an output signal of the comparator and generate the switching control signal. The bit line voltage selection unit may receive bit line voltages of the bit lines, may output a bit line voltage of a bit line selected by the bit line selection signals, and may input the bit line voltage to the comparing unit.

A read circuit of an EPROM device including a unit cell disposed between a bit line, which is coupled to a power supply line of a read voltage, and a ground voltage terminal, according to an embodiment of the present disclosure, may include a first comparator, a second comparator, a third comparator, and an encoder. The first comparator may receive a bit line voltage and a first read reference voltage smaller than a read voltage, and may generate a first output signal. The second comparator may receive the bit line voltage and a second read reference voltage smaller than the first read reference voltage, and may generate a second output signal. The third comparator may receive the bit line voltage and a third read reference voltage smaller than the second read reference voltage, and may generate a third output signal. The encoder may output binary data according to a combination of the first output signal, second output signal, and third output signal.

A read circuit of an EPROM device including a unit cell disposed between a bit line, which is coupled to a power supply line of a read voltage, and a ground voltage terminal, according to an embodiment of the present disclosure, may include a multiplexer, a comparator, and an encoder. The multiplexer may sequentially output a first read reference voltage, a second read reference voltage smaller than the first read reference voltage, and a third read reference voltage smaller than the second read reference voltage. The comparator may sequentially compare the first read reference voltage, the second read reference voltage, and the third read reference voltage sequentially input from the multiplexer, and may sequentially generate output signals. The encoder may output binary data according to a combination of the output signals sequentially output from the comparator.

BRIEF DESCRIPTION OF THE DRAWINGS

Various embodiments of an inventive concept will become more apparent in view of the attached drawings and accompanying detailed description, in which:

FIG. 4 is a table illustrating program modes and output signals in accordance with a binary data input of a decoder constituting an EPROM device according to an embodiment of the present disclosure;

FIG. 22 is a table illustrating output data according to program modes of unit cells of an EPROM device according to an embodiment of the present disclosure.

DETAILED DESCRIPTION OF THE EMBODIMENTS

Figure 1:
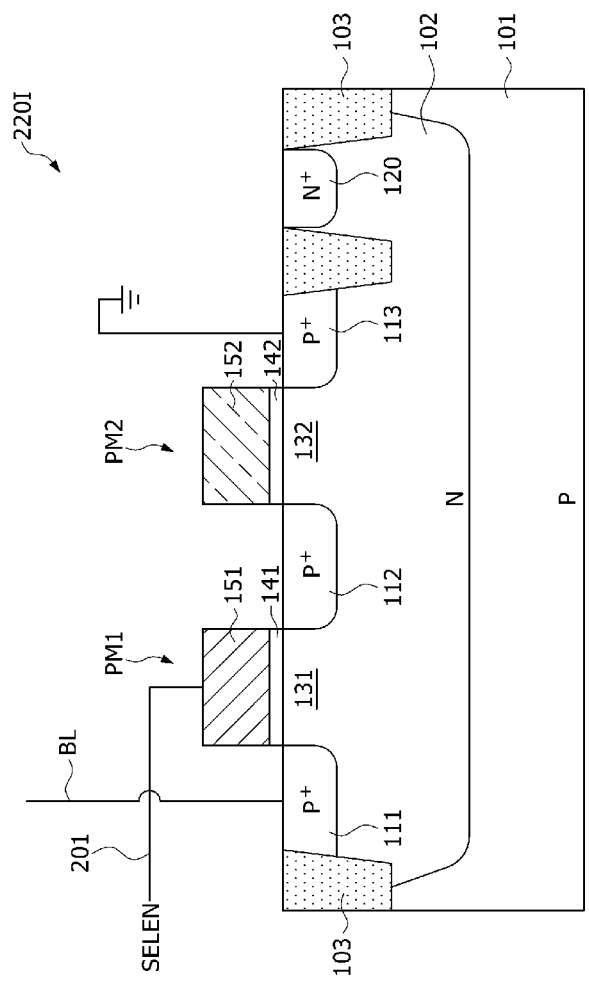
FIG. 1 is a cross-sectional view illustrating an example of a cell transistor in an initial state, which constitutes a unit cell of an EPROM device according to an embodiment of the present disclosure.

The present disclosure will be described below with reference to the accompanying drawings through various embodiments.

The present disclosure, however, may be embodied in various different forms, and should not be construed as being limited to the illustrated embodiments herein. Rather, these embodiments are provided as examples so that this disclosure will be thorough and complete, and will fully convey various aspects and features of the present disclosure to those skilled in the art.

It will be understood that, although the terms "first," "second," "third," and so on may be used herein to describe various elements, these elements are not limited by these terms. These terms are used to distinguish one element from another element. Thus, a first element described below could also be termed a second or third element without departing from the spirit and scope of the present disclosure.

The drawings are not necessarily to scale and, in some instances, proportions may have been exaggerated in order to clearly illustrate features of the embodiments.

The terminology used herein is for the purpose of describing particular embodiments only and is not intended to be limiting of the present disclosure. As used herein, singular forms are intended to include the plural forms as well, unless the context clearly indicates otherwise. It will be further understood that the terms "comprises", "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

In addition, when an element is referred to as being located "on," "over," "above," "under," or "beneath" another element, it is intended to mean relative positional relationship, but not be used to limit certain cases that the element directly contacts the other element, or at least one intervening element is present therebetween. Accordingly, the terms such as "on," "over," "above," "under," "beneath," "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

FIG. 1 is a cross-sectional view illustrating an example of a cell transistor in an initial state, which constitutes a unit cell 2201 of an EPROM device according to an embodiment of the present disclosure.

Referring to FIG. 1, the unit cell 2201 in an initial state includes an N-type well region 102 disposed in a P-type substrate 101. A trench device isolation layer 103 defining an active region may be disposed in an upper portion of the P-type substrate 101. A first $P^+$-type junction region 111, a second $P^+$-type junction region 112, and a third $P^+$-type junction region 113 are spaced apart from each other in a first region which is an upper portion of the N-type well region 102. An $N^+$-type contact region 120 is disposed in a second region which is an upper portion of the N-type well region 102. The first and second regions disposed in an upper portion of the N-type well region 102 may be isolated from each other by the trench isolation layer 103. The first $P^+$-type junction region 111 and the second $P^+$-type junction region 112 are spaced apart from each other by a first channel region 131. The second $P^+$-type junction region 112 and the third $P^+$-type junction region 113 are spaced apart from each other by a second channel region 132.

A selecting gate insulation layer 141 and a selecting gate electrode layer 151 are disposed over the first channel region 131. A floating gate insulation layer 142 and a floating gate electrode layer 152 are disposed over the second channel region 132. The first $P^+$-type junction region 111, the first channel region 131, the second $P^+$-type junction region 112, the selecting gate insulation layer 141, and the selecting gate electrode layer 151 constitute a first PMOS transistor PM1, which may be used as a selecting transistor. The second $P^+$-type junction region 112, the second channel region 132, the third $P^+$-type junction region 113, the floating gate insulation layer 142, and the floating gate electrode layer 152 constitute a second PMOS transistor PM2, which may be used as a cell transistor.

The selecting gate electrode layer 151 of the first PMOS transistor PM1, which is as a selecting transistor, is coupled to a selection enable signal line 201. The selecting gate electrode layer 151 may receive a selection enable signal SELEN through the selection enable signal line 201. The floating gate electrode layer 152 of the second PMOS transistor PM2 is electrically floating because it is not coupled to a direct electrical connection line. The first $P^+$-type junction region 111 and the second $P^+$-type junction region 112 constitute a source and a drain of the first PMOS transistor PM1, respectively. The second $P^+$-type junction region 112 and the third $P^+$-type junction region 113 constitute a source and a drain of the second PMOS transistor PM2, respectively. Accordingly, the second $P^+$-type junction region 112 acts as the drain of the first PMOS transistor PM1 and as the source of the second PMOS transistor PM2. The second $P^+$-type junction region 112 is disposed in an electrically floating state. The first P$^+$-type junction region 111 is coupled to a bit line. The third P$^+$-type junction region 113 is coupled to a ground voltage terminal.

If the second PMOS transistor PM2, which is used as a cell transistor, is in an initial state, an inversion layer is not formed in the second channel region 132. Since the floating gate electrode layer 152 is in a floating state, the second PMOS transistor PM2 remains turned off. In this case, even if the first PMOS transistor PM1, which is used as a selecting transistor, is turned on, that is, even if an inversion layer is formed in the first channel region 131, since the second PMOS transistor PM2 remains turned off, if a leakage current were not taken into account, a current does not flow between the bit line BL and the ground voltage terminal.

Figure 2:
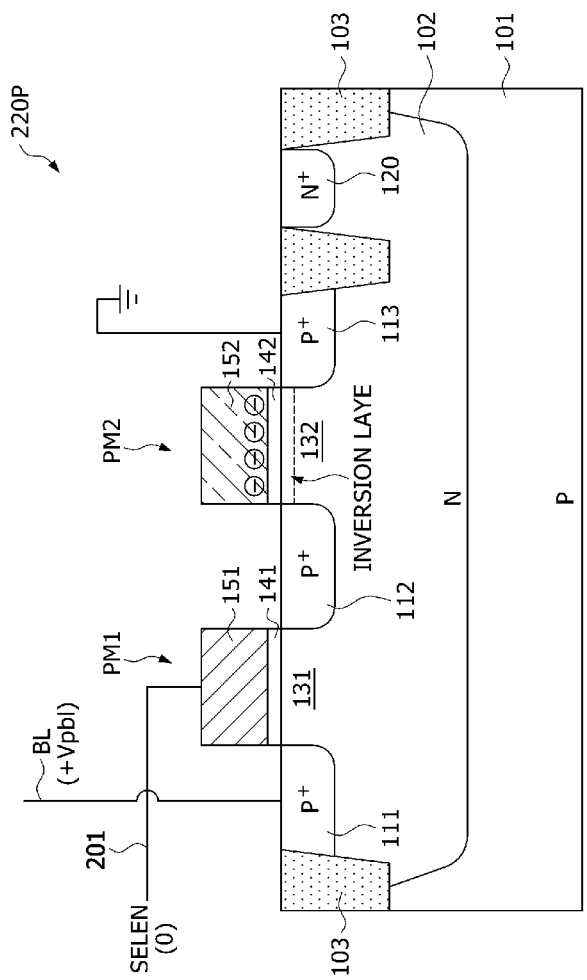
FIG. 2 is a cross-sectional view illustrating an example of a cell transistor in a programmed state, which constitutes a unit cell of an EPROM device according to an embodiment of the present disclosure.

FIG. 2 is a cross-sectional view illustrating an example of a cell transistor in a programmed state, which constitutes a unit cell 220P of the EPROM device according to an embodiment of the present disclosure. In FIG. 2, the same reference numerals or designators as those used in FIG. 1 denote the same elements, and any repetitive detailed description will be omitted or simplified.

Referring to FIG. 2, in order to form a programmed unit cell 220P, a selection enable signal SELEN at a low level, for example, a voltage of 0 V is applied to the selecting gate electrode layer 151 of the first PMOS transistor PM1. A positive program bit line voltage +Vpbl is applied to the source of the first PMOS transistor PM1, that is, the first P$^+$-type junction region 111. As a voltage of 0 V is applied to the selecting gate electrode layer 151, the first PMOS transistor PM1 is turned on. The positive program bit line voltage +Vpbl is applied to the first P$^+$-type junction region 111, and the second P$^+$-type junction region 112 is floating. Since the third P$^+$-type junction region 113 is coupled to the ground voltage terminal, hot electrons are induced in the vicinity of the second P$^+$-type junction region 112 by an electric field between the second P$^+$-type junction region 112 and the third P$^+$-type junction region 113, and the hot electrons are injected into the floating gate electrode layer 152 of the second PMOS transistor PM2. As the hot electrons are injected into the floating gate electrode layer 152, a P-type inversion layer is formed in the second channel region 132, therefore, the second PMOS transistor PM2 is turned on. Although not illustrated, a positive program bit line voltage +Vpbl may be applied to the N$^+$-type contact region 120.

As such, after the second PMOS transistor PM2, which is used as a cell transistor, is programmed, the P-type inversion layer has been formed in the second channel region 132. Accordingly, the second PMOS transistor PM2 remains turned on. When the first PMOS transistor PM1, which is used as a cell transistor, is turned on during a read operation, that is, when an inversion layer is formed in the first channel region 131, current flows between the bit line BL and the ground voltage terminal.

Figure 3:
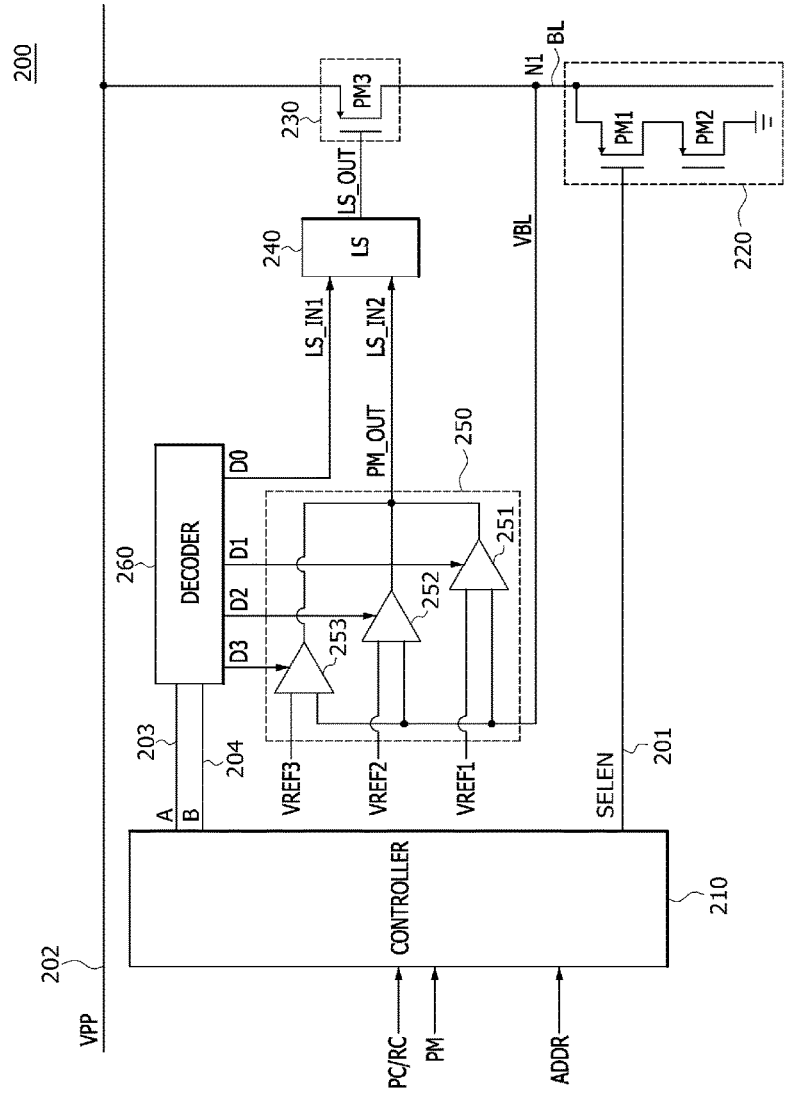
FIG. 3 is a diagram illustrating an example of an EPROM device according to an embodiment of the present disclosure.

FIG. 3 is a diagram illustrating an example of an EPROM device 200 according to an embodiment of the present disclosure. Referring to FIG. 3, the EPROM device 200 may include a controller 210, a unit cell 220, a switching unit 230, a level shifter 240, a comparing unit 250, and a decoder 260. The controller 210 receives a program/read command PC/RC and an address signal ADR. When a program command PC is input, program mode PM information is also input. In response to the address signal ADR, the unit cell 220 may be selected to perform a program or read operation. If a program command PC or a read command RC is input, the controller 210 generates a selection enable signal SELEN and sends it through a selection enable signal line 201, and generates binary data signals A and B and sends them through data output lines 203 and 204. The selection enable signal SELEN is input to the unit cell 220, and the binary data A and B is input to the decoder 260.

The unit cell 220 is composed of a first PMOS transistor PM1 and a second PMOS transistor PM2 disposed in series between the bit line BL and the ground voltage terminal. As described with reference to FIGS. 1 and 2, the first PMOS transistor PM1 constitutes a selecting transistor, and the second PMOS transistor PM2 constitutes a cell transistor. A gate of the first PMOS transistor PM1 is coupled to the controller 210 through the selection enable signal line 201. Accordingly, the selection enable signal SELEN may be applied to the gate of the first PMOS transistor PM1. A source and a drain of the first PMOS transistor PM1 are coupled to a drain of the second PMOS transistor PM2 and the bit line BL, respectively. A gate of the second PMOS transistor PM2 is floating. A source and a drain of the second PMOS transistor PM2 are coupled to a ground voltage terminal and the source of the first PMOS transistor PM1, respectively. If a selection enable signal SELEN at a low level is applied to the gate of the first PMOS transistor PM1, the first PMOS transistor PM1, which is used as a selecting transistor, is turned on. The second PMOS transistor PM2, which is used as a cell transistor, is electrically coupled to the bit line BL, a program operation or a read operation for the second PMOS transistor PM2 may be performed. On the other hand, when a selection enable signal SELEN at a high level is applied to the gate of the first PMOS transistor PM1, the first PMOS transistor PM1 is turned off. In this case, the second PMOS transistor PM2, which is as a cell transistor, is electrically disconnected from the bit line BL, and the program operation or the read operation for the second PMOS transistor PM2 is not performed.

The switching unit 230 may include a third PMOS transistor PM3 disposed between a program voltage supply line 202 and the bit line BL. An output signal LS_OUT output from the level shifter 240 is applied to a gate of the third PMOS transistor PM3. A drain and a source of the third PMOS transistor PM3 are coupled to the program voltage supply line 202 and the bit line BL, respectively. A switching operation of the third PMOS transistor PM3 is made in accordance with an output signal LS_OUT of the level shifter 240, which is applied to the gate of the third PMOS transistor PM3.

In an embodiment, when an output signal LS_OUT at a low level is applied from the level shifter 240 to the gate of the third PMOS transistor PM3, the third PMOS transistor PM3 is turned on. In this case, if a resistance component of the third PMOS transistor PM3 were not taken into account, a program supply voltage VPP supplied through the program voltage supply line 202 is applied to the bit line BL. During a period of time when both of the first PMOS transistor PM1 of the unit cell 220 and the third PMOS transistor PM3 of the switching unit 230 are turned on, a program operation for the second PMOS transistor PM2 of the unit cell 220 may be performed. On the other hand, when an output signal LS_OUT at a high level is applied from the level shifter 240 to the gate of the third PMOS transistor PM3, the third PMOS transistor PM3 is turned off. Even if the first PMOS transistor PM1 of the unit cell 220 is turned on, when the third PMOS transistor PM3 of the switching unit 230 is turned off, the program operation for the second PMOS transistor PM2 of the unit cell 220 is not performed.

The level shifter 240 receives a first input signal LS_IN1 and a second input signal LS_IN2 through a first input terminal and a second input terminal, respectively. The level shifter 240 generates the output signal LS_OUT controlling a switching operation of the third PMOS transistor PM3 of the switching unit 230, according to the first input signal LS_IN1 and the second input signal LS_IN2. The first input signal LS_IN1 is the same signal as an output signal D0 output from the decoder 260. The second input signal LS_IN2 is the same as a program mode output signal PM_OUT output from the comparing unit 250. In an embodiment, when the first input signal LS_IN1 is a high-level signal, the level shifter 240 generates an output signal LS_OUT at a high level regardless of the second input signal LS_IN2. In this case, the third PMOS transistor PM3 of the switching unit 230 is turned off. In an embodiment, when the first input signal LS_IN1 is a low-level signal, the level shifter 240 outputs the output signal LS_OUT at the same level as the second input signal LS_IN2. In other words, when the second input signal LS_IN2 is a low-level signal, the level shifter 240 generates an output signal LS_OUT at a low level, and when the second input signal LS_IN2 is a high-level signal, the level shifter 240 generates an output signal LS_OUT at a high level.

The comparing unit 250 may include a first comparator 251, a second comparator 252, and a third comparator 253. In an embodiment, the first to third comparators 251-253 are selectively operated. In other words, when a program operation begins, one of the first to third comparators 251-253 is enabled and the other comparators are disabled, according to a program mode PM. More specifically, the first comparator 251 is enabled or disabled by an output signal D1 of the decoder 260. The second comparator 252 is enabled or disabled by an output signal D2 of the decoder 260. The third comparator 253 is enabled or disabled by an output signal D3 of the decoder 260. In order to selectively enable one of the first to third comparators 251-253, the output signals D1-D3 of the decoder 260 are set such that only one of the output signals D1-D3 is enabled and the other output signals are disabled.

Output terminals of the first, second, and third comparators 251, 252, and 253 constitute a common output terminal, and a program mode output signal PM_OUT is output through the common output terminal. The program mode output signal PM_OUT constitutes the second input signal LS_IN2 input to the level shifter 240. When the first input signal LS-IN1 of the level shifter 240 is a low-level signal, a switching operation of the third PMOS transistor PM3 of the switching unit 230 may be performed according to one of the output signals of the first to third comparators 251-253. For example, in a situation where the first input signal LS_IN1 of the level shifter 240 is a low-level signal, if one of the first, second, and third comparators 251, 252, and 253 outputs a program mode output signal PM_OUT at a low level, the level shifter 240 applies an output signal LS_OUT at a low level to the gate of the third PMOS transistor PM3, and thus the third PMOS transistor PM3 is turned on. On the other hand, in a situation where the first input signal LS_IN1 of the level shifter 240 is a low-level signal, if one of the first, second, and third comparators 251, 252, and 253 outputs a program mode output signal PM_OUT at a high level, the level shifter 240 applies an output signal LS_OUT at a high level to the gate of the third PMOS transistor PM3, and thus the third PMOS transistor PM3 is turned off.

The first comparator 251 receives a first reference voltage VREF1 and a bit line voltage VBL. The second comparator 252 receives a second reference voltage VREF2 and the bit line voltage VBL. The third comparator 253 receives a third reference voltage VREF3 and the bit line voltage VBL. The bit line voltage VBL represents a voltage at a first node N1.

The first node N1 means a point that couples the drain of the first PMOS transistor PM1 constituting the unit cell 220 to the source of the third PMOS transistor PM3 constituting the switching unit 230. The first reference voltage VREF1 has a value less than the program supply voltage VPP. The second reference voltage VREF2 has a value less than the first reference voltage VREF1. The third reference voltage VREF3 has a value less than the second reference VREF2.

In an embodiment, when the first comparator 251 is enabled in response to an output signal D1 of the decoder 260 at a high level, the first comparator 251 starts to output a program mode output signal PM_OUT at a low level. The enabled first comparator 251 compares the first reference voltage VREF1 with the bit line voltage VBL, and if the bit line voltage VBL is equal to or smaller than the first reference voltage VREF1, the first comparator 251 changes the level of the program mode output signal PM_OUT to a high level. The second comparator 252 starts to output a program mode output signal PM_OUT at a low level, when the second comparator 252 is enabled in response to an output signal D2 of the decoder 260 at a high level. The enabled second comparator 252 compares the second reference voltage VREF2 with the bit line voltage VBL, and if the bit line voltage VBL is equal to or smaller than the second reference voltage VREF2, the second comparator 252 changes the level of the program mode output signal PM_OUT to a high level. The third comparator 253 starts to output a program mode output signal PM_OUT at a low level, when the third comparator 253 is enabled in response to an output signal D3 of the decoder 260 at a high level. The enabled third comparator 253 compares the third reference voltage VREF3 with the bit line voltage VBL, and if the bit line voltage VBL is equal to or smaller than the third reference voltage VREF3, the third comparator 253 changes the level of the program mode output signal PM_OUT to a high level.

The decoder 260 receives binary data signals A and B from the controller 210, and generates four output signals D0-D3. The binary data signals A and B applied to the decoder 260 functions as information that determines whether a program operation is performed and determines a program mode of the program operation. The output signal D0 from the decoder 260 constitutes the first input signal LS_IN1 of the level shifter 240. The output signal D1 of the decoder 260 determines whether the first comparator 251 is to be operated. In an embodiment, the output signal D1 at a high level acts as an enable signal of the first comparator 251, and the output signal D1 at a low level acts as a disable signal of the first comparator 251. The output signal D2 of the decoder 260 determines whether the second comparator 252 is to be operated. In an embodiment, the output signal D2 at a high level acts as an enable signal of the second comparator 252, and the output signal D2 at a low level acts as a disable signal of the second comparator 252. The output signal D3 of the decoder 260 determines whether the third comparator 253 is to be operated. In an embodiment, the output signal D3 at a high level acts as an enable signal of the third comparator 253, and the output signal D3 at a low level acts as a disable signal of the third comparator 253.

Hereinafter, operations according to program modes of an EPROM device in accordance with an embodiment of the present disclosure will be described in detail.

FIG. 4 is a table illustrating program modes and output signals in accordance with binary data inputs of a decoder constituting an EPROM device according to an embodiment of the present disclosure.

Referring to FIG. 4 and FIG. 3, when a program command PC and a program mode PM are input to the controller 210, the controller 210 outputs a selection enable signal SELEN at a low level and binary data signals A and B according to the program mode. The binary data signals A and B input to the decoder 260 may be composed of four combinations in accordance with the program mode PM. In an embodiment, the program mode PM may be one of a non-program mode PM0, a first program mode PM1, a second program mode PM2, and a third program mode PM3. When the combination of the binary data signals A and B input to the decoder 260 is "00," the decoder 260 generates output signals D0-D3 for the non-program mode PM0. The output signal D0 constituting the first input signal LS_IN1 of the level shifter 240 is a high-level signal. The remaining output signals D1-D3 are low-level signals. Accordingly, in the non-program mode PM0, the level shifter 240 outputs a high-level signal regardless of which signal level the second input signal LS_IN2 has. The output signal LS_OUT at a high level may turn off the third PMOS transistor PM3.

When the combination of the binary data signals A and B input to the decoder 260 is "01," the decoder 260 generates output signals D0-D3 for the first program mode PM1. In this case, the output signal D1 of the decoder 260 is a high-level signal, and the remaining output signals D0, D2, D3 are low-level signals. When the combination of the binary data signals A and B input to the decoder 260 is "10," the decoder 260 generates output signals D0-D3 for the second program mode PM2. In this case, the output signal D2 of the decoder 260 is a high-level signal, and the remaining output signals D0, D1, D3 are low-level signals. When the combination of the binary data signals A and B input to the decoder 260 is "11," the decoder 260 generates output signals D0-D3 for the third program mode PM3. In this case, the output signal D3 of the decoder 260 is a high level signal, and the remaining output signals D0, D1, D2 are low level signals.

Figure 5:
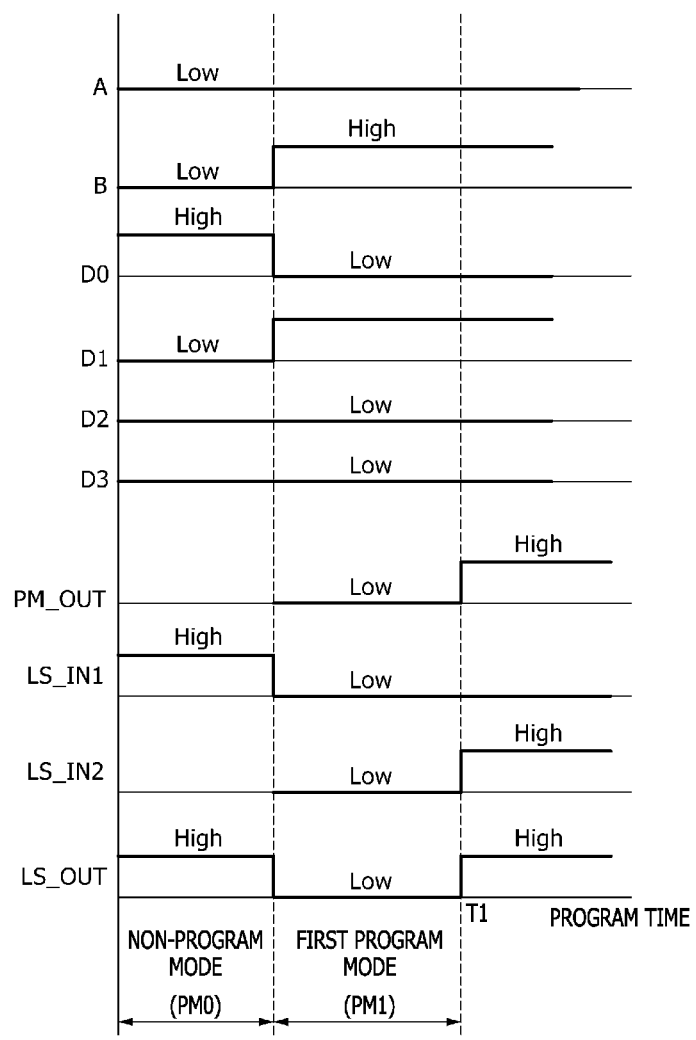
FIG. 5 is a timing diagram illustrating an example of a program operation in a first program mode of an EPROM device according an embodiment of the present disclosure.
Figure 6:
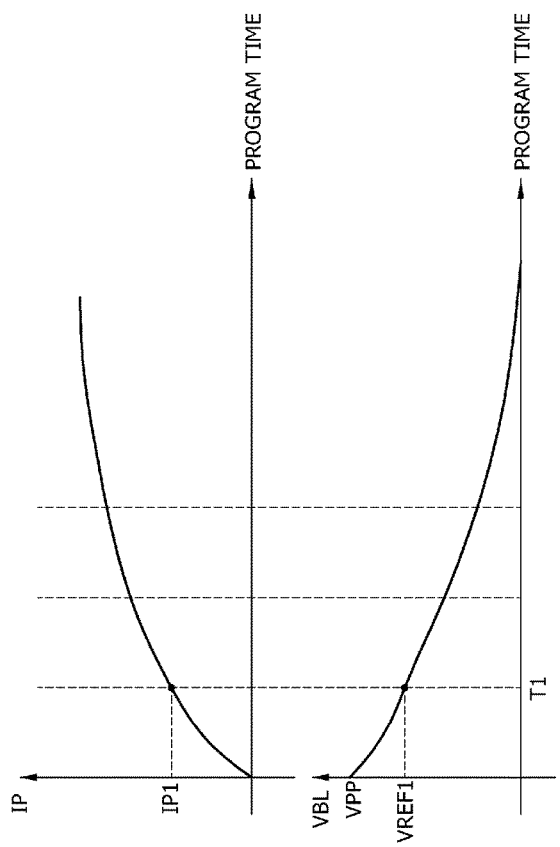
FIG. 6 is a graph illustrating variations of a program current and a bit line voltage during a program operation in a first program mode of an EPROM device according to an embodiment of the present disclosure.

FIG. 5 is a timing diagram illustrating an example of a program operation in a first program mode of an EPROM device according an embodiment of the present disclosure. FIG. 6 is a graph illustrating variations of a program current and a bit line voltage during the program operation in the first program mode of the EPROM device according to an embodiment of the present disclosure.

Referring to FIGS. 3 through 5, when a read command RC is input to the controller 210 or the unit cell 220 is in an idle state in which a program operation or a read operation is not performed, the controller 210 inputs data "00" as a combination of binary data signals A and B corresponding to a non-program mode PM0 to the decoder 260. The decoder 260 allows only the output signal D0 constituting the first input signal LS_IN1 of the level shifter 240, among the output signals D0-D3, to be at a high level High, and the remaining output signals D1, D2, D3 are at low levels Low. As the output signals D1, D2, D3 are at low levels Low, the first, second, and third comparators 251, 252, and 253, which constitute the comparing unit 250, become disabled. Accordingly, a program mode output signal PM_OUT of the comparing unit 250 is not generated. Since the output signal D0 is at a high level High, the first input signal LS_IN1 at a high level High is input to the level shifter 240. The level shifter 240 generates a high-level signal High as the output signal LS_OUT regardless of the second input signal LS_IN2. The high-level signal High is applied to the gate of the third PMOS transistor PM3 constituting the switching unit 230. The third PMOS transistor PM3 is turned off, and the program operation for the unit cell 220 is not performed.

In this state, when a program command PC for a first program mode PM1 is input to the controller 210, the controller 210 inputs, to the decoder 260, data "01" as the combination of the binary data signals A and B corresponding to the first program mode PM1. The decoder 260 allows only the output signal D1 applied to the first comparator 251 of the comparing unit 250 to be at a high level High, and the remaining signals D0, D2, D3 are at low levels Low. Since the output signal D0 constituting the first input signal LS_IN1 of the level shifter 240 is at a low level Low, an output signal LS_OUT generated by the level shifter 240 is at the same level as the second input signal LS_IN2. As both of the output signals D2 and D3 are at low levels Low, both of the second comparator 252 and the third comparator 253 constituting the comparing unit 250 are disabled. On the other hand, as the output signal D1 is at a high level High, the first comparator 251 constituting the comparing unit 250 is enabled. Also, a program mode output signal PM_OUT of the comparing unit 250 is composed of the output signal of the first comparator 251.

The first comparator 251 enabled by the output signal D1 of the decoder 260 at a high level generates a low-level signal Low as the program mode output signal PM_OUT. The low-level signal Low is input to the level shifter 240 as the second input signal LS_IN2. Since the first input signal LS_IN1 is a low-level signal Low, the level shifter 240 outputs a signal of the same level as the second input signal LS_IN2, that is, a low-level signal Low. The low-level signal Low is input to the gate of the third PMOS transistor PM3, and turns on the third PMOS transistor PM3. As the third PMOS transistor PM3 is turned on, the program operation for the second PMOS transistor PM2, which is used as a cell transistor of the unit cell 220, is performed.

As illustrated in FIG. 6, when the program operation according to the first program mode PM1 is performed, as described with reference to FIG. 2, electrons are injected into the floating gate electrode layer of the second PMOS transistor PM2, and therefore, a program current IP starts to flow. As the program operation continues, an amount of the electrons injected into the floating gate electrode layer of the second PMOS transistor PM2 gradually increases. As a result, the program current IP flowing through the unit cell 220 gradually increases. As the program current IP increases, an amount of a voltage drop due to resistance components of the first PMOS transistor PM1 and the second PMOS transistor PM2 increases, and the bit line voltage VBL of the first node N1 starts to gradually decrease from the program supply voltage VPP. At a first time point T1, the program current IP increases to a first program current IP1, and the bit line voltage VBL decreases to a first reference voltage VREF1. In an embodiment, the first program current IP1 may be defined as a program current IP flowing through the unit cell 220 when the bit line voltage VBL becomes the first reference voltage VREF1.

Referring back to FIGS. 3 and 5, the first comparator 251 compares the first reference voltage VREF1 with the bit line voltage VBL. As a result of the comparison, a program mode output signal PM_OUT is maintained at the low-level Low during a period of time when the bit line voltage VBL is greater than the first reference voltage VREF1. Also, the program operation for the unit cell 220 is continuously performed. At the first time point T1 when the bit line voltage VBL reaches the first reference voltage VREF1, the first comparator 251 generates a program mode output signal PM_OUT changed into a high-level signal High. The high-level signal High is input to the level shifter 240 as the second input signal LS_IN2. Since the first input signal LS_IN1 is a low-level signal Low, the level shifter 240 generates an output signal LS_OUT at the same level as the second input signal LS_IN2, that is, a high-level signal High. The high-level signal High is applied to the gate of the third PMOS transistor PM3 of the comparing unit 230, and the third PMOS transistor PM3 is turned off. As the third PMOS transistor PM3 is turned off, the program operation for the unit cell 220 is no longer performed. Accordingly, the unit cell 220 programmed in the first program mode PM1 becomes a state that would allow a first program current IP1 to flow.

Figure 7:
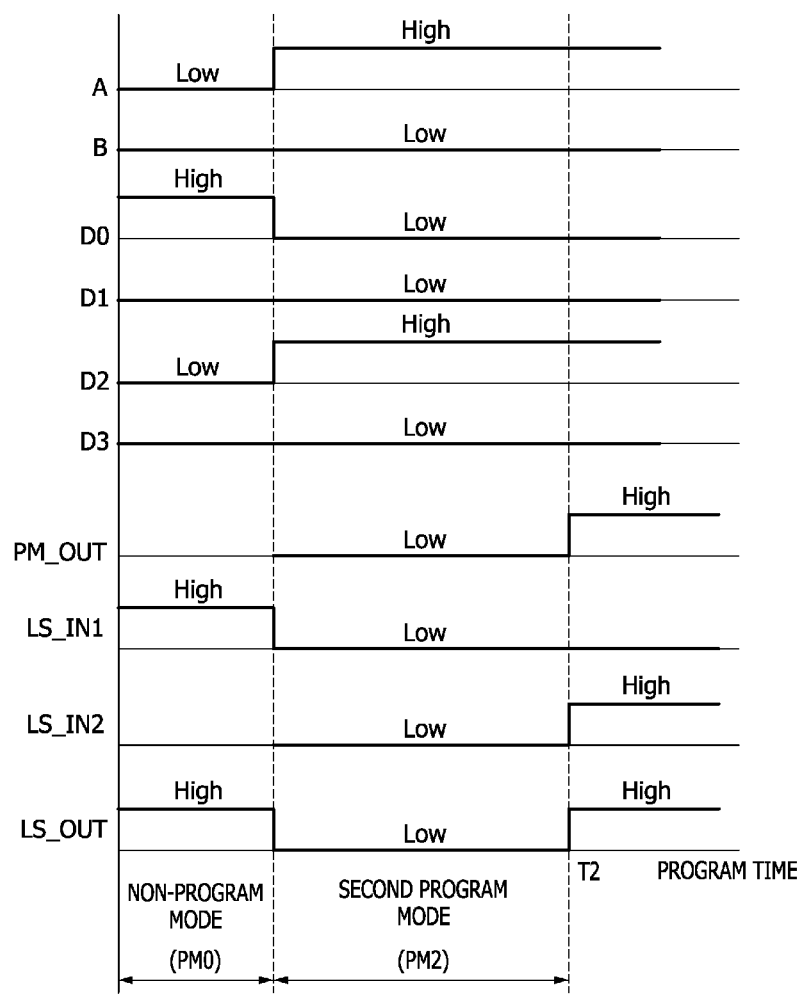
FIG. 7 is a timing diagram illustrating an example of a program operation in a second program mode of an EPROM device according an embodiment of the present disclosure.
Figure 8:
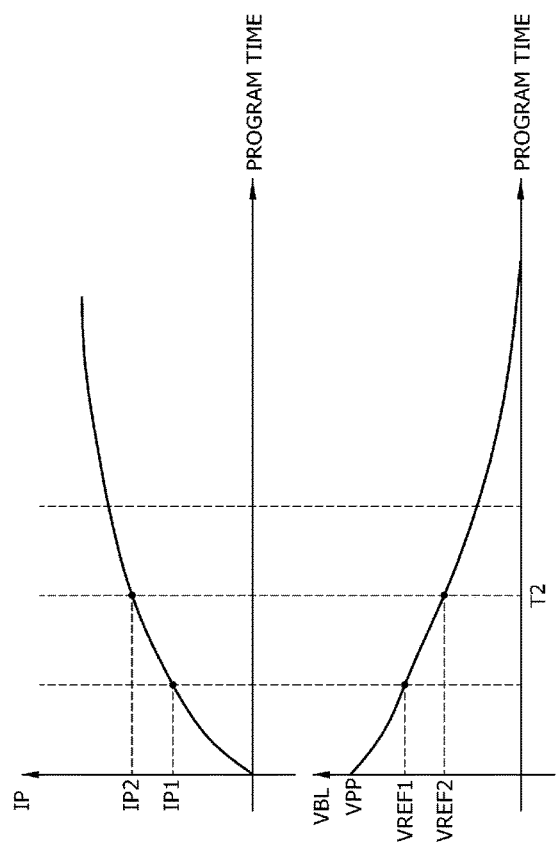
FIG. 8 is a graph illustrating variations of a program current and a bit line voltage during a program operation in a second program mode of an EPROM device according to an embodiment of the present disclosure.

FIG. 7 is a timing diagram illustrating an example of a program operation in a second program mode of an EPROM device according an embodiment of the present disclosure. FIG. 8 is a graph illustrating variations of a program current and a bit line voltage during the program operation in the second program mode of the EPROM device according to an embodiment of the present disclosure.

Referring to FIGS. 3, 4, and 7, when a read command RC is input to the controller 210, or the unit cell 220 is in an idle state in which a program operation or read operation is not performed, the controller 210 inputs, to the decoder 260, "00" as a combination of binary data signals A and B corresponding to a non-program mode PM0. The decoder 260 allows only one output signal D0 constituting a first input signal LS_IN1 of the level shifter 240, among output signals D0-D3, to be at a high level High, and the remaining output signals D1, D2, D3 are at low levels Low. As the output signals D1, D2, D3 are at low levels Low, the first comparator 251, the second comparator 252, and the third comparator 253 constituting the comparing unit 250 are disabled, and thus a program mode output signal PM_OUT is not generated from the comparing unit 250. Since the output signal D0 is at a high level High, a first input signal LS_IN1 at a high level High is input to the level shifter 240. The level shifter 240 generates a high-level signal High as an output signal LS_OUT regardless of the second input signal LS_IN2. The high-level signal High is applied to the gate of the third PMOS transistor PM3 constituting the switching unit 230. The third PMOS transistor PM3 is turned off, and the program operation for the unit cell 220 is not performed.

In this state, when a program command PC for a second program mode PM2 is input to the controller 210, the controller 210 inputs "10" as a combination of binary data signals A and B corresponding to the second program mode PM2 to the decoder 260. The decoder 260 allows only one output signal D2 applied to the second comparator 252 of the comparing unit 250, among the output signals D0-D3, to be at a high level High, and the remaining output signals D0, D1, D3 are at low levels Low. Since the output signal D0 constituting the first input signal LS_IN1 of the level shifter 240 is at a low level Low, the level shifter 240 generates an output signal LS_OUT at the same level as the second input signal LS_IN2. Since both of the output signals D1, D3 are at high levels High, the first comparator 251 and the third comparator 253 constituting the comparing unit 250 are disabled. On the other hand, as the output signal D2 is at a high level High, the second comparator 252 constituting the comparing unit 250 is enabled. Also, the program mode output signal PM_OUT of the comparing unit 250 is composed of the output signal of the second comparator 252.

In response to the output signal D2 of the decoder 260 at a high level, the second comparator 252 generates a low-level signal Low as the program mode output signal PM_OUT. The low-level signal Low is input to the level shifter 240 as the second input signal LS_IN2. Since the first input signal LS_IN1 is at a low level Low, the level shifter 240 outputs a signal at the same level as the second input signal LS_IN2, that is, a low-level signal Low. The low-level signal Low is applied to the gate of the third PMOS transistor PM3, and turns on the third PMOS transistor PM3. As the third PMOS is turned on, the program operation for the second PMOS transistor PM2, which is used as a cell transistor of the unit cell 220, is performed.

As illustrated in FIG. 8, when the program operation according to the second program mode PM2 is performed, as described with reference to FIG. 2, electrons are injected into the floating gate electrode layer of the second PMOS transistor PM2, and thus a program current IP starts to flow. As the program operation continues, an amount of the electrons injected into the floating gate electrode layer of the second PMOS transistor PM2 gradually increases. As a result, the program current IP flowing through the unit cell 220 gradually increases. As the program current IP flowing through the unit cell 220 increases, an amount of a voltage drop due to resistance components of the first PMOS transistor PM1 and the second PMOS transistor PM2 increases, and the bit line voltage VBL of a first node N1 starts to gradually decrease from the program supply voltage VPP. At a second time point T2, the program current IP increases to a second program current IP2, and the bit line voltage VBL decreases to the second reference voltage VREF2. In an embodiment, the second program current IP2 may be defined as a program current IP flowing through the unit cell 220 when the bit line voltage VBL becomes the second reference voltage VREF2. The second reference voltage VREF2 has a value less than the first reference voltage VREF1, and thus the second program current IP2 has a value greater than the first program current IP1.

Referring back to FIGS. 3 and 7, the second comparator 252 compares the second reference voltage VREF2 with the bit line voltage VBL. As a result of the comparison, during a period of time when the bit line voltage VBL is greater than the second reference voltage VREF2, the program mode output signal PM_OUT is maintained at the low-level Low. Also, the program operation for the unit cell 220 is continuously performed. At the second time point T2 when the bit line voltage VBL reaches the second reference voltage VREF2, the second comparator 252 generates the program mode output signal PM_OUT changed into a high-level signal High. The high-level signal High is input to the level shifter 240 as the second input signal LS_IN2. Since the first input signal LS_IN1 is a low-level signal Low, the level shifter 240 generates an output signal LS_OUT at the same level as the second input signal LS_IN2, that is, a high-level signal High. The high-level signal High is applied to the gate of the third PMOS transistor PM3 of the switching unit 230, and the third PMOS transistor PM3 is turned off. As the third PMOS transistor PM3 is turned off, the program operation for the unit cell 220 is no longer performed. Accordingly, the unit cell 220 programmed in the second program mode PM2 becomes a state that would allow the second program current IP2 to flow.

Figure 9:
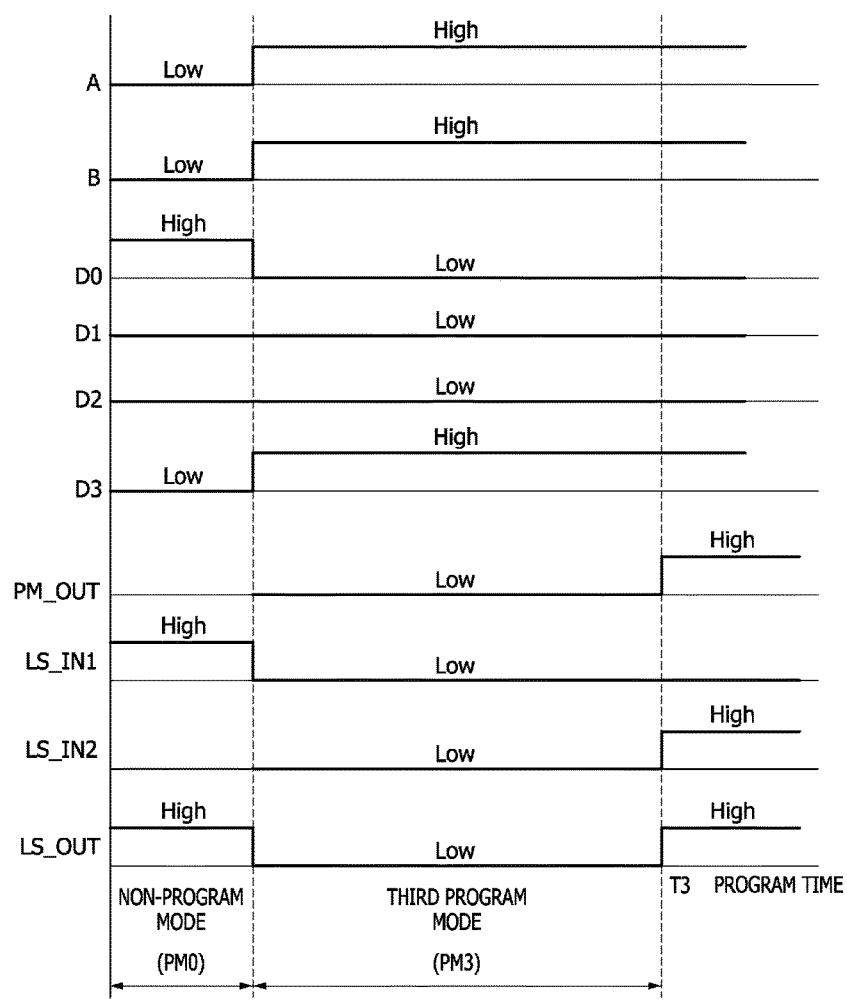
FIG. 9 is a timing diagram illustrating an example of a program operation in a third program mode of an EPROM device according to an embodiment of the present disclosure.
Figure 10:
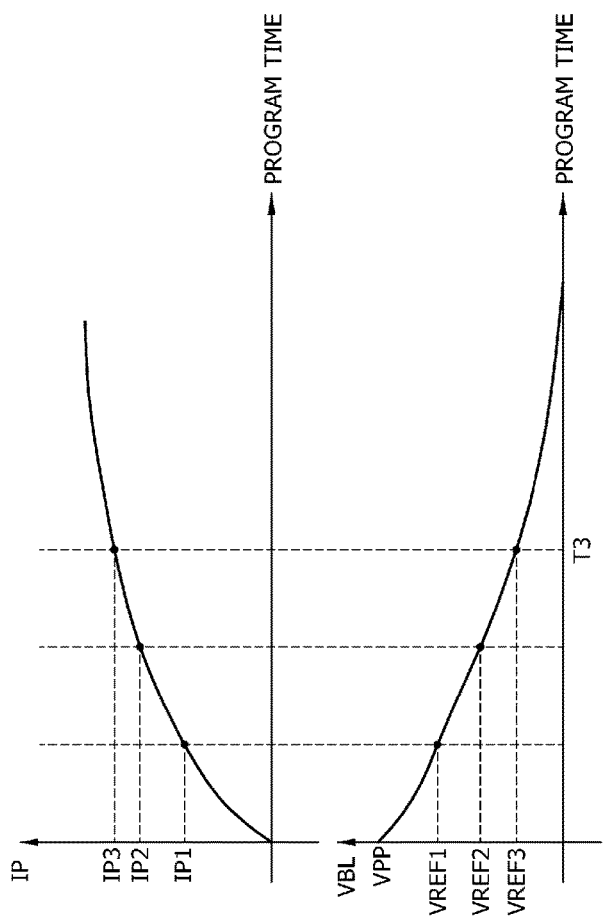
FIG. 10 is a graph illustrating variations of a program current and a bit line voltage during a program operation in a third program mode of an EPROM device according to an embodiment of the present disclosure.

FIG. 9 is a timing diagram illustrating an example of a program operation in a third program mode of an EPROM device according to an embodiment of the present disclosure. FIG. 10 is a graph illustrating variations of a program current and a bit line voltage during the program operation in the third program mode of the EPROM device according to an embodiment of the present disclosure.

Referring first to FIGS. 3, 4, and 9, when a read command RC is input to the controller 210, or the unit cell 220 is in an idle state in which a program operation or read operation is not performed, the controller 210 inputs, to the decoder 260, "00" as a combination of binary data signals A and B corresponding to a non-program mode PM0. The decoder 260 allows only one output signal D0 constituting a first input signal LS_IN1 of the level shifter 240, among output signals D0-D3, to be at a high level High, and the remaining output signals D1, D2, D3 are at low levels Low. As the output signals D1, D2, D3 are at low levels Low, the first comparator 251, the second comparator 252, and the third comparator 253 constituting the comparing unit 250 are disabled. Therefore, a program mode output signal PM_OUT is not generated from the comparing unit 250. Since the output signal D0 is at a high level High, a first input signal LS_IN1 at a high level is input to the level shifter 240. The level shifter 240 generates a high-level signal High as an output signal LS_OUT regardless of a second input signal LS_IN2. The high-level signal High is applied to the gate of the third PMOS transistor PM3 constituting the switching unit 230. The third PMOS transistor PM3 is turned off, and the program operation for the unit cell 220 is not performed.

In this state, when a program command PC for a third program mode PM3 is input to the controller 210, the controller 210 inputs "11" as a combination of binary data signals A and B corresponding to the third program mode PM3 to the decoder 260. The decoder 260 allows only one output signal D3 applied to the third comparator 253 of the comparing unit 250, among the output signals D0-D3, to be at a high level High, and the remaining output signals D0, D1, D2 are at low levels Low. Since the output signal D0 constituting the first input signal LS_IN1 of the level shifter 240 is at a low level Low, the level shifter 240 generates an output signal LS_OUT at the same level as the second input signal LS_IN2. Since both of the output signals D1, D2 are at low levels Low, the first comparator 251 and the second comparator 252 constituting the comparing unit 250 are disabled. On the other hand, as the output signal D3 is at a high level High, the third comparator 253 constituting the comparing unit 250 is enabled. Also, the program mode output signal PM_OUT of the comparing unit 250 is composed of the output signal of the third comparator 253.

In response to the output signal D3 of the decoder 260 at a high level, the third comparator 253 generates a low-level signal Low as the program mode output signal PM_OUT. The low-level signal Low is input to the level shifter 240 as the second input signal LS_IN2. Since the first input signal LS_IN1 is a low-level signal Low, the level shifter 240 outputs a signal at the same level as the second input signal LS_IN2, that is, a low-level signal Low. The low-level signal Low is applied to the gate of the third PMOS transistor PM3, and turns on the third PMOS transistor PM3. As the third PMOS transistor is turned on, the program operation for the second PMOS transistor PM2, which is as a cell transistor of the unit cell 220, is performed.

As illustrated in FIG. 10, when the program operation according to the third program mode PM3 is performed, as described with reference to FIG. 2, electrons are injected into a floating gate electrode layer of the second PMOS transistor PM2, and thus a program current IP starts to flow. As the program operation continues, an amount of the electrons injected into the floating gate electrode layer of the second PMOS transistor PM2 gradually increases. As a result, the program current IP flowing through the unit cell 220 gradually increases. As the program current IP flowing through the unit cell 220 increases, an amount of voltage drop due to resistance components of the first PMOS transistor PM1 and the second PMOS transistor PM2 increases, and a bit line voltage VBL of a first node N1 starts to gradually decrease from the program supply voltage VPP. At a third time point T3, the program current IP increases to a third program current IP3, and the bit line voltage VBL decreases to a third reference voltage VREF3. In an embodiment, the third program current IP3 may be defined as a program current IP flowing through the unit cell 220 when the bit line voltage VBL reaches the third reference voltage VREF3. The third reference voltage VREF3 has a value less than the second reference voltage VREF2, and thus the third program current IP3 has a value greater than the second program current IP2.

Referring back to FIG. 9 with FIG. 3, the third comparator 253 compares the third reference voltage VREF3 with the bit line voltage VBL. As a result of the comparison, during a period of time when the bit line voltage VBL is greater than the third reference voltage VREF3, a program mode output signal PM_OUT is maintained at the low-level Low. Also, the program operation for the unit cell 220 is continuously performed. At the third time point T3 when the bit line voltage VBL reaches the third reference voltage VREF3, the second comparator 252 generates a program mode output signal PM_OUT changed into a high-level signal High. The high-level signal High is input to the level shifter 240 as a second input signal LS_IN2. Since the first input signal LS_IN1 is a low-level signal Low, the level shifter 240 generates an output signal LS_OUT at the same level as the second input signal LS_IN2, that is, a high-level signal High. The high-level signal High is applied to the gate of the third PMOS transistor PM3 of the switching unit 230, and the third PMOS transistor PM3 is turned off. As the third PMOS transistor PM3 is turned off, the program operation for the unit cell 220 is not performed any more. Accordingly, the unit cell 220 programmed in the third program mode PM3 becomes a state that would allow the third program current IP3 to flow.

Figure 11:
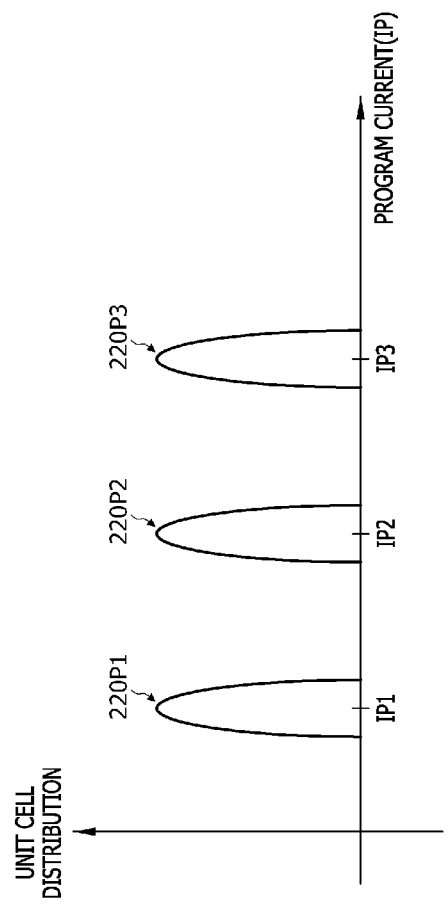
FIG. 11 is a graph illustrating a relationship between a number of unit cells of an EPROM device, which are programmed according to each program mode, and a program current.

FIG. 11 is a graph illustrating a relationship between a number of unit cells of an EPROM device, which are programmed according to each program mode, and a program current.

Referring to FIG. 11, program currents IP flowing through the programmed unit cells varies according to the program modes. A program current IP corresponding to a first program current IP1 and its neighboring program current values may flow through the first unit cells 220P1 programmed in a first program mode PM1. A program current IP corresponding to a second program current IP2, which is greater than the first program current IP1, and its neighboring program current values may flow through the second unit cells 220P2 programmed in a second program mode PM2. A program current IP corresponding to a third program current IP3, which is greater than the second program current IP2, and its neighboring program current values may flow through the third unit cells 220P3 programmed in a third program mode PM3. Since the program current IP does not flow through unprogrammed unit cells, that is, unit cells at an initial state, whether the unit cell is in the programmed state or in the initial state may be determined on the basis of the presence of the program current IP. Also, which program mode the unit cell is programmed in may be determined according to an amount of the program current IP.

Figure 12:
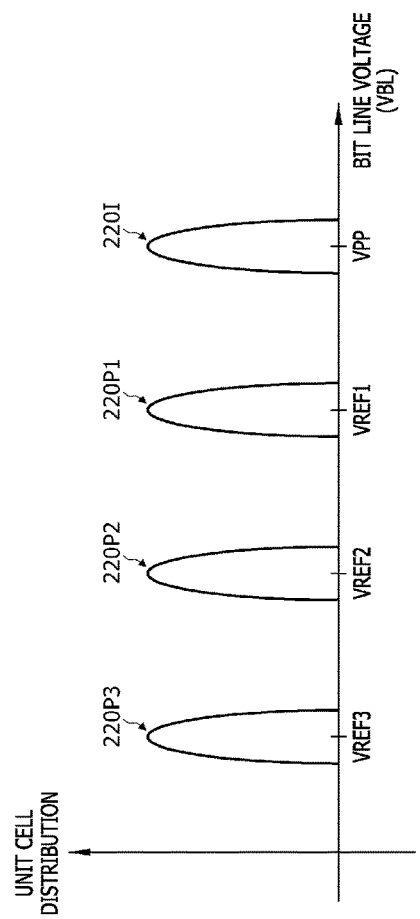
FIG. 12 is a graph illustrating a distribution of unit cells for a bit line voltage of an EPROM device according to an embodiment of the present disclosure by each program mode.

FIG. 12 is a graph illustrating a distribution of unit cells for a bit line voltage of an EPROM device according to an embodiment of the present disclosure by each program mode.

Referring to FIG. 12, if the unit cells 2201 are in initial states, since a program current IP does not flow through the unit cells 2201, the unit cells are open-circuited, and a bit line voltage VBL has a value of a program supply voltage VPP. If the unit cells 220P1 are programmed in a first program mode PM1, the bit line voltage VBL has a value corresponding to the first reference voltage VREF1 and its neighboring values. If the unit cells 220P2 are programmed in a second program mode PM2, the bit line voltage VBL has a value corresponding to the second reference voltage VREF2, which is smaller than the first reference voltage VREF1, and its neighboring values. If the unit cells 220P3 are programmed in a third program mode PM3, the bit line voltage VBL has a value corresponding to the third reference voltage VREF3, which is smaller than the second reference voltage VREF2, and its neighboring values.

Figure 13:
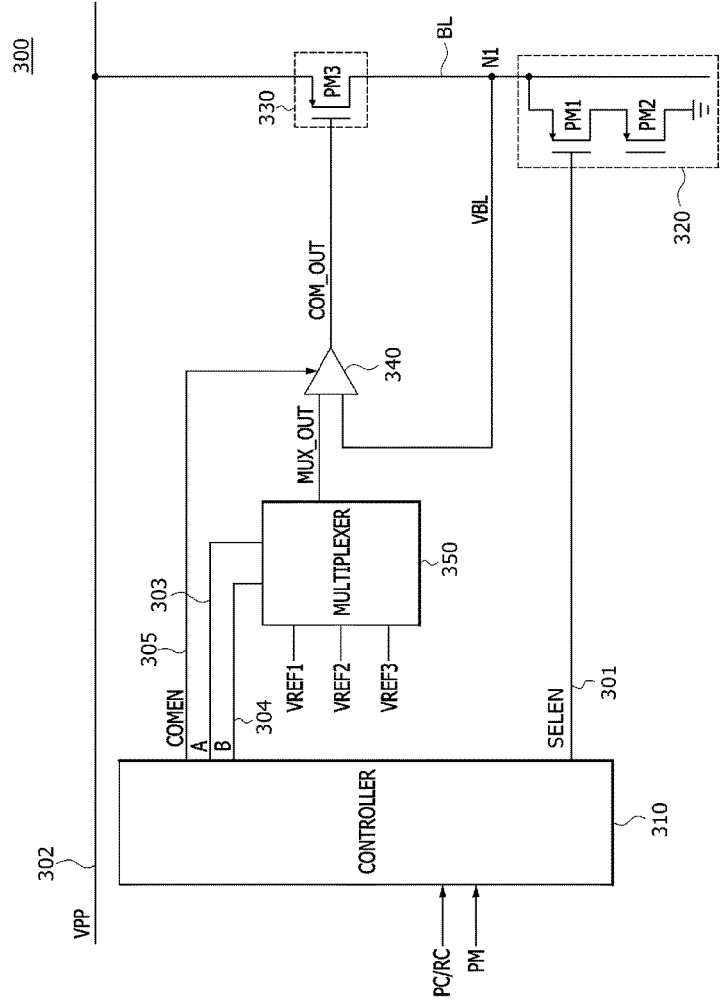
FIG. 13 is a circuit diagram illustrating an example of an EPROM device according to an embodiment of the present disclosure.

FIG. 13 is a circuit diagram illustrating an example of an EPROM device 300 according to an embodiment of the present disclosure.

Referring to FIG. 13, the EPROM device 300 according to an embodiment may include a controller 310, a unit cell 320, a switching unit 330, a comparator 340, and a multiplexer 350. The controller 310 receives program and/or read command PC/RC from an external device (e.g., a host). Information on a program mode PM is also input to the controller 310 when the program command PC is input. When a program command PC or a read command RC is input, the controller 310 generates a selection enable signal SELEN and send it through a selection enable signal line 301, generates binary data signals A and B through selection lines 303 and 304, and generates a comparator enable signal COMEN through a comparator enable signal line 305. The selection enable signal SELEN is input to the unit cell 320. The binary data signals A and B are input to the multiplexer 350. The comparator enable signal COMEN is input to the comparator 340.

The unit cell 320 is composed of a first PMOS transistor PM1 and a second PMOS transistor PM2, which are disposed in series between a bit line BL and a ground voltage terminal. As described with reference to FIGS. 1 and 2, the first PMOS transistor PM1 constitutes a selecting transistor, and the second PMOS transistor PM2 constitutes a cell transistor. A gate of the first PMOS transistor PM1 is coupled to the controller 310 through the selection enable signal line 301. Accordingly, the selection enable signal SELEN may be applied to the gate of the first PMOS transistor PM1. A source and a drain of the first PMOS transistor PM1 are coupled to a drain of the second PMOS transistor PM2 and the bit line BL, respectively. A gate of the second PMOS transistor PM2 is electrically floating. A source and the drain of the second PMOS transistor PM2 are coupled to the ground voltage terminal and the source of the first PMOS transistor PM1, respectively.

When a selection enable signal SELEN at a low level is applied to the gate of the first PMOS transistor PM1 which is used as a selecting transistor, the first PMOS transistor PM1 is turned on. The second PMOS transistor PM2, which is used as a cell transistor, is electrically connected to the bit line BL, and a program operation or a read operation for the second PMOS transistor PM2 may be performed. On the other hand, when a selection enable signal SELEN at a high level is applied to the gate of the first PMOS transistor PM1, the first PMOS transistor PM1 is turned off. In this case, the second PMOS transistor PM2, which is used as a cell transistor, is electrically disconnected from the bit line BL, and neither program operation nor a read operation is performed on the second PMOS transistor PM2.

The switching unit 330 may include a third PMOS transistor PM3 disposed between the program voltage supply line 302 and the bit line BL. An output signal COM_OUT of the comparator 340 is applied to a gate of the third PMOS transistor PM3. A source and a drain of the third PMOS transistor PM3 are coupled to the program voltage supply line 302 and the bit line BL, respectively. A switching operation of the third PMOS transistor PM3 is performed according to the output signal COM_OUT of the comparator 340 applied to the gate of the third PMOS transistor PM3.

In an embodiment, when an output signal COM_OUT at a low level is applied from the comparator 340 to the gate of the third PMOS transistor PM3, the third PMOS transistor PM3 is turned on. In this case, if a resistance component of the third PMOS transistor PM3 were not taken into account, a program supply voltage VPP supplied through the program voltage supply line 302 is applied to the bit line BL. A program operation for the second PMOS transistor PM2 of the unit cell 320 can be performed during a period of time when both of the first PMOS transistor PM1 of the unit cell 320 and the third PMOS transistor PM3 of the switching unit 330 are turned on. On the other hand, if an output signal COM_OUT at a high level, which is output from the comparator 340, is applied to the gate of the third PMOS transistor PM3, the third PMOS transistor PM3 is turned off. If the third PMOS transistor PM3 of the switching unit 330 is turned off, the program operation for the second PMOS transistor PM2 is not performed even if the first PMOS transistor PM1 of the unit cell 320 is turned on.

The comparator 340 is enabled by a comparator enable signal COMEN output from the controller 310, and receives an output signal MUX_OUT of the multiplexer 350 and the bit line voltage VBL through a first input terminal and a second input terminal, respectively. Also, the comparator 340 generates an output signal COM_OUT controlling the switching operation of the third PMOS transistor PM3 of the switching unit 330 on the basis of a signal level of the comparator enable signal COMEN, a value of the output signal MUX_OUT of the multiplexer 350, and a value of the bit line voltage VBL. The bit line voltage VBL represents a voltage of a first node N1. The first node N1 means a point that couples the drain of the first PMOS transistor PM1 constituting the unit cell 320 to the source of the third PMOS transistor PM3 constituting the switching unit 330. In an embodiment, when a comparator enable signal COMEN at a high level is applied to the comparator 340, the comparator 340 is enabled and generates a comparator output signal COM_OUT at a low level. On the other hand, when a comparator enable signal COMEN at a low level is applied to the comparator 340, the comparator 340 is disabled. In an embodiment, when the comparator 340 is disabled, the comparator 340 may generate a comparator output signal COM_OUT at a high level. In a state in which the comparator 340 is enabled, the comparator 340 compares the output signal MUX_OUT of the multiplexer 350 with the bit line voltage VBL, and if the bit line voltage VBL becomes equal to or smaller than the output signal MUX_OUT of the multiplexer 350, the comparator 340 changes a comparator output signal COM_OUT to a high-level signal.

The multiplexer 350 outputs one selected from a first reference voltage VREF1, a second reference voltage VREF2, and a third reference voltage VREF3 using the binary data signals A and B input through two selection lines 303 and 304. The first reference voltage VREF1 has a value less than the program supply voltage VPP and greater than the second reference voltage VREF2. The second reference voltage VREF2 has a value greater than the third reference voltage VREF3. The binary date signals A and B applied to the multiplexer 350 functions as information determining a program mode when performing a program operation. For example, in a case of performing a program operation in a first program mode, the first reference voltage VREF1 is output from the multiplexer 350 by the binary data signals A and B. In a case of performing a program operation in a second program mode, the second reference voltage VREF2 is output from the multiplexer 350 by the binary data signals A and B. In addition, in a case of performing a program operation in a third program mode, the third reference voltage VREF3 is output from the multiplexer 350 by the binary data signals A and B.

Figure 14:
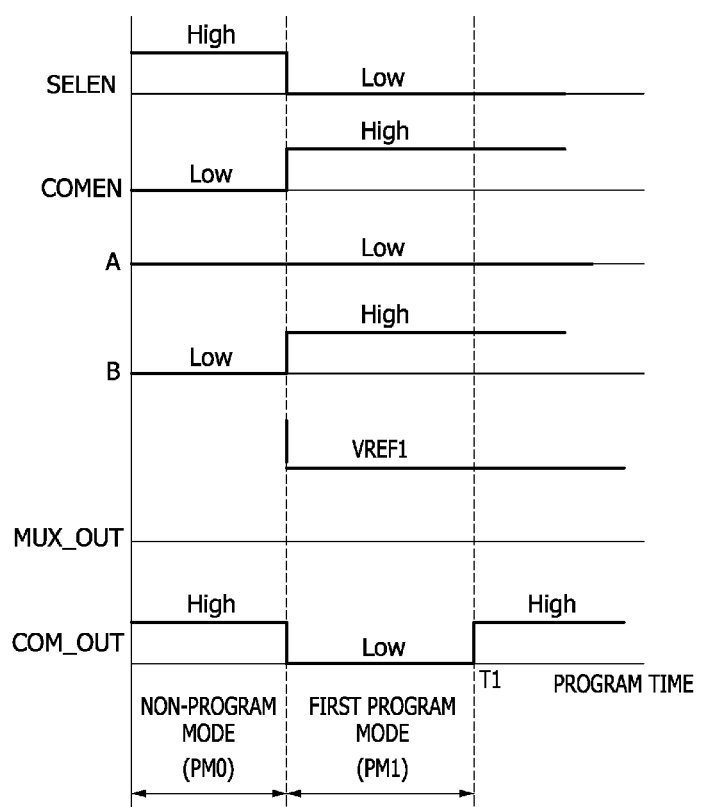
FIG. 14 is a timing diagram illustrating an example of a program operation in a first program mode of an EPROM device according to an embodiment of the present disclosure.

FIG. 14 is a timing diagram illustrating an example of a program operation in a first program mode of the EPROM device according to an embodiment of the present disclosure.

Referring to FIGS. 13 and 14, in a case of an idle state in which a program operation or a read operation is not performed, the controller 310 turns off the first PMOS transistor PM1 by applying a high-level signal High as a selection enable signal SELEN to the gate of the first PMOS transistor PM1. In addition, the controller 310 disables the comparator 340 by applying a low-level signal Low as a comparator enable signal COMEN to the comparator 340. As the comparator 340 is disabled, a high-level signal High can be generated as a comparator output signal COM_OUT, and the third PMOS transistor PM3 is turned off. The controller 310 inputs "00" as a combination of binary data signals A and B corresponding to a non-program mode PM0 to the multiplexer 350. When a selection data "00" is input as the combination of binary data signals A and B to the multiplexer 350, the multiplexer 350 does not generate the multiplexer output signal MUX_OUT. Accordingly, the comparator output signal COM_OUT is maintained at the high level High. As the first PMOS transistor PM1, which is used as a selecting transistor of the unit cell 320, is turned off and the third PMOS transistor PM3 of the switching unit 330 is turned off, a program operation for the second PMOS transistor PM2, which is used as a cell transistor of the unit cell 320, is not performed.

In this state, when a program command PC for a first program mode PM1 is input to the controller 310, the controller 310 generates a low-level signal Low as a selection enable signal SELEN, and a high-level signal High as a comparator enable signal COMEN. The low-level signal Low is applied as a selection enable signal SELEN to the gate of the first PMOS transistor PM1 to allow the first PMOS transistor PM1 to be turned on. A comparator enable signal COMEN at a high level enables the comparator 340. The enabled comparator 340 outputs a low-level signal Low as a comparator output signal COM_OUT. The low-level signal Low turns on the third PMOS transistor PM3. As such, as both of the first PMOS transistor PM1 and the third PMOS transistor PM3 are turned on, a program operation for the second PMOS transistor PM2 starts to be performed.

The controller 310 inputs, to the multiplexer 350, selection data "00" as a combination of binary data signals A and B corresponding to the first program mode PM1. The a data signal "0" means a low-level signal Low, and a data signal "1" means a high-level signal High. The multiplexer 350 outputs the third reference voltage VRE1, among the first through third reference voltages VREF1, VREF2, and VREF3, as a comparator output signal COM_OUT in response to the selection data "01," which is a combination of binary data signals A and B. The first reference voltage VREF1 and the bit line voltage VBL are input to the comparator 340. The comparator 340 compares the first reference voltage VREF1 with the bit line voltage VBL, and thus the comparator output signal COM_OUT is maintained at the low level during a period of time when the bit line voltage VBL is greater than the first reference voltage VREF1. During a period of time when the comparator output signal COM_OUT is maintained at a low level Low, the program operation according to the first program mode PM1 is continuously performed.

As described with reference to FIG. 11, as the program operation according to the first program mode PM1 continues, an amount of a program current IP flowing through the unit cell 320 increases, and thus the bit line voltage VBL of the first node N1 gradually decreases from the program supply voltage VPP. As a program time reaches a first time point T1 when the bit line voltage VBL decreases to the first reference voltage VREF1, the comparator 340 generates a comparator output signal COM_OUT changed into a high-level signal High. The high-level signal High is applied to the gate of the third PMOS transistor PM3 of the switching unit 330, and the third PMOS transistor PM3 is turned off. As the third PMOS transistor PM3 is turned off, the program operation for the unit cell 320 is no longer performed. Therefore, a bit line voltage VBL corresponding to the unit cell 320 programmed in the first program mode PM1 is a voltage that is identical to the first reference voltage VREF1 or its neighboring values.

Figure 15:
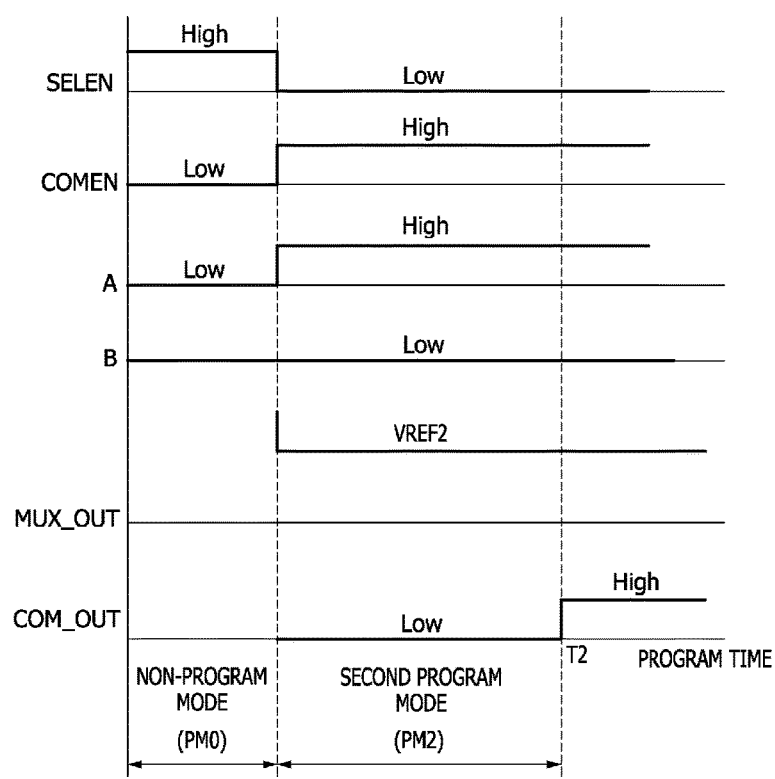
FIG. 15 is a timing diagram illustrating an example of a program operation in a second program mode of an EPROM device according to an embodiment of the present disclosure.

FIG. 15 is a timing diagram illustrating an example of a program operation in a second program mode of the EPROM device according to an embodiment of the present disclosure.

Referring to FIGS. 13 and 15, in a state where no program operation is performed by a non-program mode PM0, when a program command PC for the second program mode PM2 is input to the controller 310, the controller 310 generates a low-level signal Low as a selection enable signal SELEN and a high-level signal High as a comparator enable signal COMEN. A selection enable signal SELEN at a low level is applied to the gate of the first PMOS transistor PM1 and turns on the first PMOS transistor PM1. A comparator enable signal COMEN at a high level enables the comparator 340. The enabled comparator 340 outputs a low-level signal Low as a comparator output signal COM_OUT. The low-level signal Low turns on the third PMOS transistor PM3. As such, as both of the first PMOS transistor PM1 and the third PMOS transistor PM3 are turned on, the program operation for the second PMOS transistor PM2 starts to be performed.

The controller 310 inputs, to the multiplexer 350, selection data "10," which is a combination of binary data signals A and B, corresponding to the second program mode PM2. The multiplexer 350 outputs the second reference voltage VRE2, among the first through third reference voltages VREF1, VREF2, and VREF3, as a comparator output signal COM_OUT in response to the selection data "10," which is a combination of binary data signals A and B. The second reference voltage VREF2 and the bit line voltage VBL are input to the comparator 340. The comparator 340 compares the second reference voltage VREF2 with the bit line voltage VBL, and thus the comparator output signal COM_OUT is maintained at the low level during a period of time when the bit line voltage VBL is greater than the second reference voltage VREF2. During a period of time when the comparator output signal COM_OUT is maintained at a low level Low, the program operation according to the second program mode PM2 is continuously performed.

As described with reference to FIG. 11, as the program operation according to the second program mode PM2 continues, an amount of a program current IP flowing through the unit cell 320 gradually increases, and thus the bit line voltage VBL of the first node N1 gradually decreases from the program supply voltage VPP. As a program time reaches a second time point T2 when the bit line voltage VBL decreases to the second reference voltage VREF2, the comparator 340 generates a comparator output signal COM_OUT changed into a high-level signal High. The high-level signal High is applied to the gate of the third PMOS transistor PM3 of the switching unit 330, and the third PMOS transistor PM3 is turned off. As the third PMOS transistor PM3 is turned off, the program operation for the unit cell 320 is no longer performed. Therefore, a bit line voltage VBL corresponding to the unit cell 320 programmed in the second program mode PM2 is a voltage that is identical to the second reference voltage VREF2 or its neighboring values.

Figure 16:
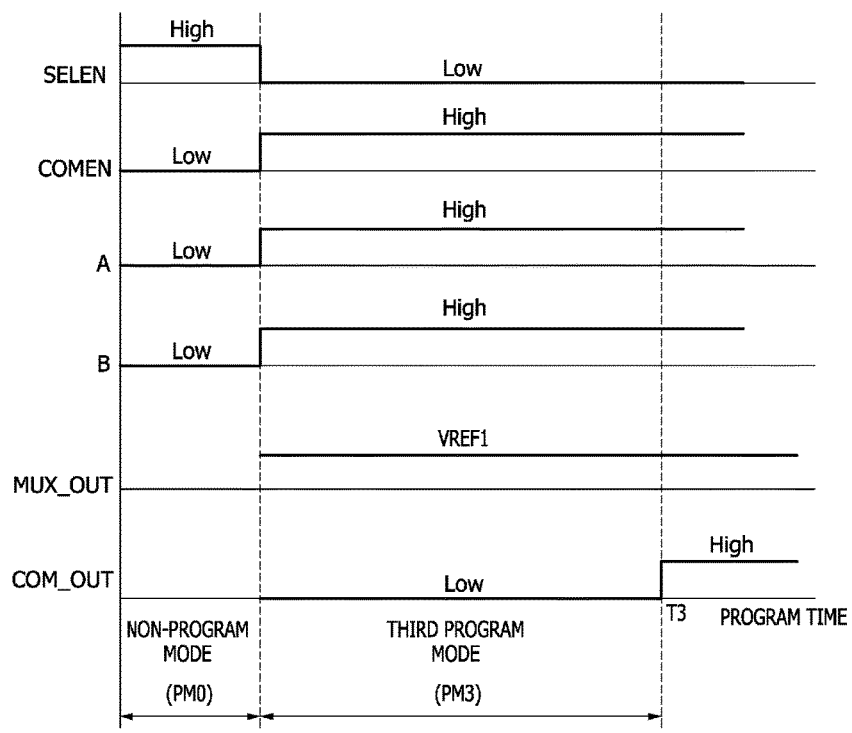
FIG. 16 is a timing diagram illustrating an example of a program operation in a third program mode of an EPROM device according to an embodiment of the present disclosure.

FIG. 16 is a timing diagram illustrating an example of a program operation in a third program mode of the EPROM device according to an embodiment of the present disclosure.

Referring to FIGS. 13 and 16, in a state where no program operation is performed according to the non-program mode PM0, when a program command PC for the third program mode PM3 is input to the controller 310, the controller 310 generates a low-level signal Low as a selection enable signal SELEN and a high-level signal High as a comparator enable signal COMEN. A selection enable signal SELEN at a low level is applied to the gate of the first PMOS transistor PM1 and turns on the first PMOS transistor PM1. A comparator enable signal COMEN at a high level enables the comparator 340. The enabled comparator 340 outputs a low-level signal Low as a comparator output signal COM_OUT. The low-level signal Low turns on the third PMOS transistor PM3. As such, as both of the first PMOS transistor PM1 and the third PMOS transistor PM3 are turned on, the program operation for the second PMOS transistor PM2 starts to be performed.

The controller 310 inputs, to the multiplexer 350, selection data "11," which is a combination of binary data signals A and B, corresponding to the third program mode PM3. The multiplexer 350 outputs the third reference voltage VRE3, among the first through third reference voltages VREF1, VREF2, and VREF3, as a comparator output signal COM_OUT in response to the selection data "11," which is a combination of binary data signals A and B. The third reference voltage VREF3 and the bit line voltage VBL are input to the comparator 340. The comparator 340 compares the third reference voltage VREF3 with the bit line voltage VBL, and thus the comparator output signal COM_OUT is maintained at the low level during a period of time when the bit line voltage VBL is greater than the third reference voltage VREF3. During a period of time when the comparator output signal COM_OUT is maintained at a low level Low, the program operation according to the third program mode PM3 is continuously performed.

As described with reference to FIG. 11, as the program operation according to the third program mode PM3 continues, an amount of a program current IP flowing through the unit cell 320 gradually increases, and thus the bit line voltage VBL of the first node N1 gradually decreases from the program supply voltage VPP. As a program time reaches a third time point T3 when the bit line voltage VBL decreases to the third reference voltage VREF3, the comparator 340 generates a comparator output signal COM_OUT changed into a high-level signal High. The high-level signal High is applied to the gate of the third PMOS transistor PM3 of the switching unit 330, and the third PMOS transistor PM3 is turned off. As the third PMOS transistor PM3 is turned off, the program operation for the unit cell 320 is no longer performed. Therefore, a bit line voltage VBL corresponding to the unit cell 320 programmed in the third program mode PM3 is a voltage that is identical to the third reference voltage VREF3 or its neighboring values.

In the EPROM device according to an embodiment, a relationship between a distribution of the unit cells, which are programmed according to the program mode, and the program current is the same as the graphs illustrated in FIG. 11. In addition, a relationship between a distribution of the unit cells, which are programmed according to the program mode, and the bit line voltage is the same as the graphs illustrated in FIG. 12. Therefore, in a case of a first unit cells programmed in the first program mode PM1, a program current IP having a value corresponding to a first program current IP1 and its neighboring values may flow through the first unit cells. A program current IP corresponding to a second program current IP2, which is greater than the first program current IP1, and its neighboring values may flow through the second unit cells programmed in the second program mode PM2. A program current IP corresponding to a third program current IP3, which is greater than the second program current IP2, and its neighboring values may flow through the third unit cells programmed in the third program mode PM3. Similarly, in a case of the first unit cells programmed in the first program mode PM1, the bit line voltage VBL has a value corresponding to the first reference voltage VREF1 and its neighboring values. In a case of the second unit cells programmed in the second program mode PM2, the bit line voltage VBL has a value corresponding to the second reference voltage VREF2, which is smaller than the first reference voltage VREF1, and its neighboring values. In a case of the third unit cells programmed in the third program mode PM3, the bit line voltage VBL has a value corresponding to the third reference voltage VREF3, which is smaller than the second reference voltage VREF2, and its neighboring values.

Figure 17:
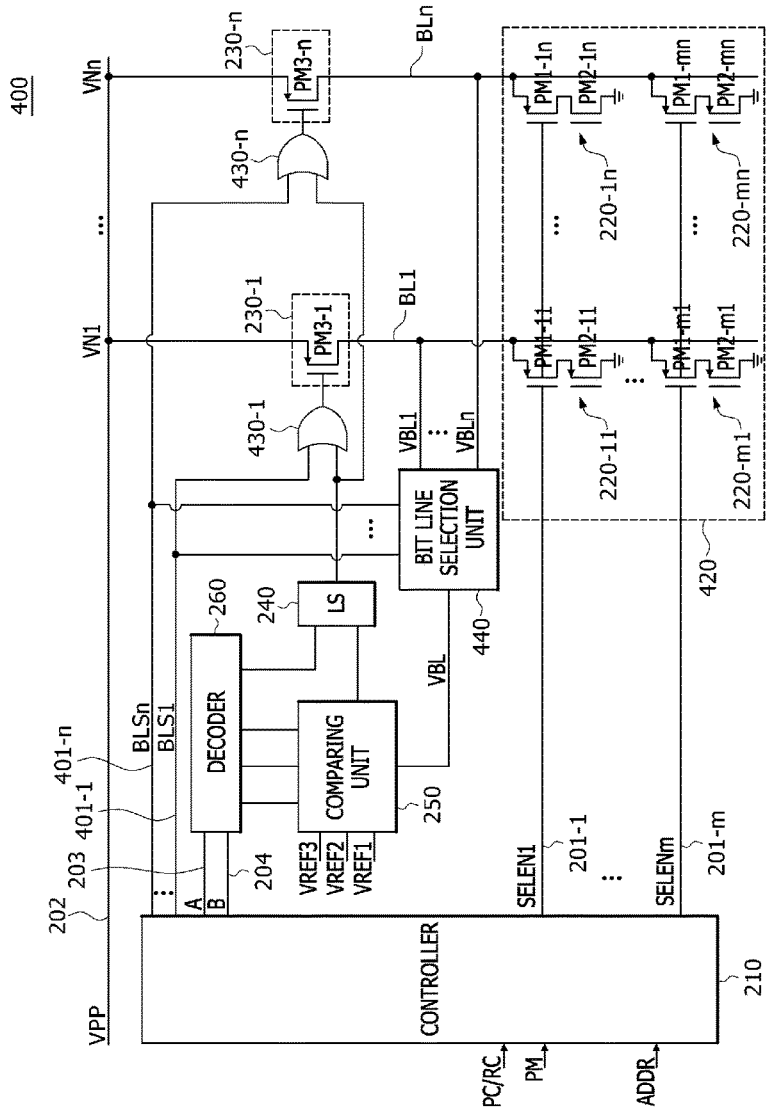
FIG. 17 is a circuit diagram illustrating an example of an EPROM device according to an embodiment of the present disclosure.
Figure 18:
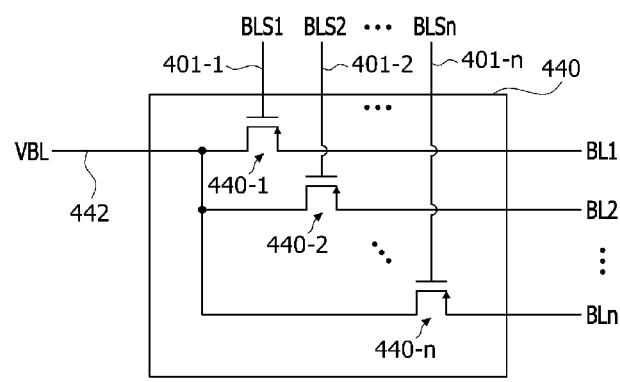
FIG. 18 is a circuit diagram illustrating an example of a bit line selection unit of an EPROM device according to an embodiment of the present disclosure.

FIG. 17 is a circuit diagram illustrating an example of an EPROM device 400 according to an embodiment of the present disclosure. FIG. 18 is a circuit diagram illustrating an example of a bit line selection unit 440 of the EPROM device according to an embodiment of the present disclosure. In FIG. 17, the same reference numerals or designators as those used in FIG. 3 denote the same elements, and any repetitive detailed description will be omitted or simplified.

Referring first to FIG. 17, the EPROM device 400 according to an embodiment includes a controller 210, a cell array 420, a plurality of switching units 230-1, . . . , 230-n, a plurality of OR gates 430-1, . . . , 430-n, a level shifter 240, a comparing unit 250, a decoder 260, and a bit line voltage selection unit 440.

The cell array 420 is composed of a plurality of unit cells 220-11, . . . , 220-1n, . . . , 220-m1, . . . , 220-mn. Each of the unit cells 220-11, . . . , 220-1n, . . . , 220-m1, . . . , 220-mn is disposed at intersections where a plurality of the bit lines BL1, . . . , BLn and a plurality of the selection enable lines 201-1, . . . , 201-m intersect with each other. Accordingly, the cell array 420 may have a matrix type of m×n. Each of the bit lines BL1, . . . , BLn constitutes a column of the cell array 420, and each of the selection enable lines 201-1, . . . , 201-m constitutes a row of the cell array 420. A first selection enable line 201-1 is coupled in common to the unit cells 220-11, . . . , 220-1n disposed in a first row. An $m^{th}$ selection enable line 201-m is coupled in common to the unit cells 220-m1, . . . , 220-mn disposed in an $m^{th}$ row. A first bit line BL1 is coupled in common to the unit cells 220-11, . . . , 220-m1 disposed in a first column. An $n^{th}$ bit line BLn is coupled in common to the unit cells 220-1n, ..., 220-mn disposed in an $n^{th}$ column.

Each of the unit cells 220-11, ..., 220-1n, ..., 220-m1, ..., 220-mn may have the same structure as a structure described with reference to FIGS. 1 and 2. A unit cell 220-11 of a first row and a first column includes a first PMOS transistor PM1-11 and a second PMOS transistor PM2-11, which are disposed in series between the first bit line BL1 and a ground voltage terminal. The first PMOS transistor PM1-11 and second PMOS transistor PM2-11 constitute a selecting transistor and a cell transistor of the unit cell 220-11, respectively. A unit cell 220-1n of the first row and $n^{th}$ column includes a first PMOS transistor PM1-1n and a second PMOS transistor PM2-1n, which are disposed in series between an $n^{th}$ bit line BLn and a ground voltage terminal. The first PMOS transistor PM1-1n and second PMOS transistor PM2-1n constitute a selecting transistor and a cell transistor of the unit cell 220-1n, respectively. A unit cell 220-m1 of the $m^{th}$ row and first column includes a first PMOS transistor PM1-m1 and a second PMOS transistor PM2-m1, which are disposed in series between the first bit line BL1 and a ground voltage terminal. The first PMOS transistor PM1-m1 and second PMOS transistor PM2-m1 constitute a selecting transistor and a cell transistor of the unit cell 220-m1, respectively. A unit cell 220-mn of the $m^{th}$ row and $n^{th}$ column includes a first PMOS transistor PM1-mn and a second PMOS transistor PM2-mn, which are disposed in series between the $n^{th}$ bit line BLn and a ground voltage terminal. The first PMOS transistor PM1-mn and second PMOS transistor PM2-mn constitute a selecting transistor and a cell transistor of the unit cell 220-mn, respectively.

Gates of the first PMOS transistors PM1-11, ..., PM1-1n of the unit cells 220-11, ..., 220-1n of the first row are coupled in common to a first selection enable line 201-1. Gates of the first PMOS transistors PM1-m1, ..., PM1-mn of the unit cells 220-m1, ..., 220-mn of the $m^{th}$ row are coupled in common to a $m^{th}$ selection enable line 201-m. Sources of the second PMOS transistors PM2-11, ..., PM2-m1 of the unit cells 220-11, ..., 220-m1 of a first column are coupled in common to the first bit line BL1. Sources of the second PMOS transistors PM2-1n, ..., PM2-mn of the unit cells 220-1n, ..., 220-mn of the $n^{th}$ column are coupled in common to the $n^{th}$ bit line BLn.

Each of the plurality of switching units 230-1, ..., 230-n is disposed between the program voltage supply line 202 and each of the bit lines. The first bit line BL1 is coupled to the program voltage supply line 202 through a first node VN1. A first switching unit 230-1 is disposed between the first node VN1 and the first bit line BL1. As described with reference to FIG. 3, the first switching unit 230-1 may be composed of a first-third PMOS transistor PM3-1. A source and a drain of the first-third PMOS transistor PM3-1 are coupled to the first node VN1 and the first bit line BL1. Similarly, the $n^{th}$ bit line BLn is coupled to the program voltage supply line 202 through an $n^{th}$ node VNn. An $n^{th}$ switching unit 230-n is disposed between the $n^{th}$ node VNn and the $n^{th}$ bit line BLn. As described with reference to FIG. 3, the $n^{th}$ switching unit 230-n may be composed of an $n^{th}$-third PMOS transistor PM3-n. A source and drain of the $n^{th}$-third PMOS transistor PM3-n are coupled to the $n^{th}$ node VNn and the $n^{th}$ bit line BLn.

The plurality of OR gates 430-1, ..., 430-n is coupled to gates of the third PMOS transistors PM3-1, ..., PM3-n, respectively. More specifically, the gate of the first-third PMOS transistor PM3-1 is coupled to an output line of a first OR gate 430-1. Similarly, the gate of the $n^{th}$-third PMOS transistor PM3-n is coupled to an output line of an $n^{th}$ OR gate 430-n. Input terminals of the first OR gate 430-1 are coupled to a first bit line selection signal line 401-1, which is coupled to the controller 210, and an output line of the level shifter 240, respectively. Input terminals of the $n^{th}$ OR gate 401-n are coupled to an $n^{th}$ bit line selection signal line 401-n, which is coupled to the controller 210, and an output line of the level shifter 240, respectively. The output line of the level shifter 240 is coupled in common to input terminals of the OR gates from the first OR gate 430-1 to the $n^{th}$ OR gate 430-n.

The bit line selection unit 440 is disposed between the plurality of bit lines BL1, ..., BLn and the comparing unit 250. As illustrated in FIG. 18, the bit line selection unit 440 may be composed of a plurality of switching devices 440-1, 440-2, ..., 440-n. Each of the plurality of switching devices 440-1, 440-2, ..., 440-n may be composed of a PMOS transistor. A source of a first switching device 440-1 is coupled to the first bit line BL1. A source of a second switching device 440-2 is coupled to a second bit line BL2. Similarly, a source of an $n^{th}$ switching device 440-n is coupled to the $n^{th}$ bit line BLn. A drain of each of the switching devices 440-1, 440-2, ..., 440-n is coupled to a common output line 442. A gate of the first switching device 440-1 is coupled to a first bit line selection signal line 401-1. A gate of the second switching device 440-2 is coupled to a second bit line selection signal line 401-2. Similarly, a gate of the $n^{th}$ switching device 440-n is coupled to an $n^{th}$ bit line selection signal line 401-n.

The bit line voltage selection unit 440 selectively outputs a bit line voltage VBL of one bit line selected from a plurality of bit lines BL1, BL2, ..., BLn. A bit line may be selected by bit line selection signals BLS1, BLS2, ..., BLSn input from the plurality of bit line selection signal lines 401-1, ..., 401-n. For example, when the first bit line BL1 is selected, the first bit line selection signal BLS1 becomes a low-level signal, and other bit line selection signals become high-level signals. In this case, only the first switching device 440-1 is turned on, and the remaining switching devices 440-2, ..., 440-n are turned off. Accordingly, the bit line selection unit 440 selectively outputs a bit line voltage VBL of the first bit line BL1.

In the EPROM device 400 according to an embodiment, in order to perform a program operation or a read operation, a unit cell (hereinafter, referred to as a "selected unit cell") needs to be selected as a program target cell or a read target cell among the unit cells 220-11, ..., 220-1n, ..., 220-m1, ..., 220-mn constituting the cell array 420. To this end, a row and a column coupled to the selected unit cell need to be selected. The row including the selected unit cell may be selected by selection enable signals SELEN1, ..., SELENm generated from the controller 210. For example, when a unit cell 220-11 (hereinafter, referred to as a "selected unit cell") disposed at a first row and a first column is scheduled to be programmed, in order to select the first row in which the selected unit cell 220-11 is included, the controller 210 generates a low-level signal as a first selection enable signal SELEN1, and generates high-level signals as the remaining selection enable signals. In this case, the first PMOS transistors PM1-11, ..., PM1-1n of the unit cells 220-11, ..., 220-1n of the first row are turned on, whereas the first PMOS transistors of each of the unit cells of the remaining rows are turned off.

In order to select the first column in which the selected unit cell 220-11 is included, the controller 210 generates a low-level signal and send it through the first bit line selection signal line 401-1, and generates high-level signals and send them through the remaining bit line selection signal lines . . . , 401-$n$. As a low-level signal is input through the first bit line selection signal line 401-1, the first OR gate 430-1 outputs an output signal at the same level as an output signal of the level shifter 240. As a result, the first-third PMOS transistor PM3-1 is turned off when the output signal of the level shifter 240 is at a high level, and turned on when the output signal of the level shifter 240 is at a low level. In addition, as a low-level signal is input through the first bit line selection signal line 401-1, the bit line voltage selection unit 440 transfers a bit line voltage VBL1 of the first bit line BL1 to the comparing unit 250. Therefore, in this case, the same operation as the program operation for the unit cell 220 of FIG. 3 may be performed for the selected unit cell 220-11 of the cell array 420. On the other hand, as high-level signals are input through the bit line selection signal line, each of the remaining OR gates 430-2 (not illustrated), . . . , 430-$n$ outputs a high-level signal regardless of the level of the output signal of the level shifter 240. Therefore, each of the remaining third PMOS transistors PM3-2 (not illustrated), . . . , PM3-$n$ remains turned off.

Figure 19:
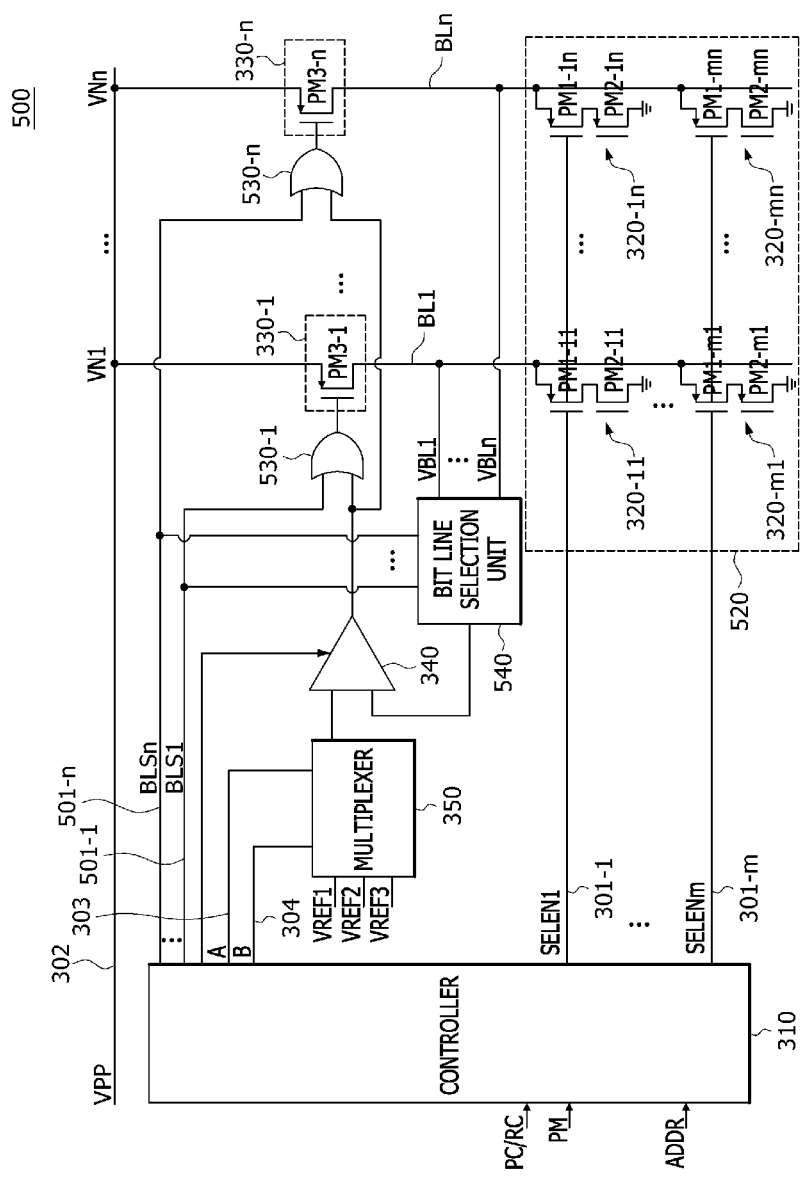
FIG. 19 is a circuit diagram illustrating an example of an EPROM device according to an embodiment of the present disclosure.

FIG. 19 is a circuit diagram illustrating an example of an EPROM device according to an embodiment of the present disclosure. In FIG. 19, the same reference numerals or designators as used in FIG. 13 denote the same elements, and any repetitive detailed description will be omitted or simplified.

Referring to FIG. 19, the EPROM device 500 according to an embodiment may include a controller 310, a cell array 520, a plurality of switching units 330-1, . . . , 330-$n$, a plurality of OR gates 530-1, . . . , 530-$n$, a comparator 340, a multiplexer 350, and a bit line voltage selection unit 540. The cell array 520 is composed of a plurality of unit cells 320-11, . . . , 320-1$n$, 320-$m$1, . . . , 320-$mn$. A configuration of the cell array 520 is the same as the configuration of the cell array 420 described with reference to FIG. 17. Gates of the first PMOS transistors PM1-11, . . . , PM1-1$n$ of the unit cells 320-11, . . . , 320-1$n$ of a first row are coupled in common to a first selection enable line 301-1. Gates of the first PMOS transistors PM1-$m$1, . . . , PM1-$mn$ of the unit cells 320-$m$1, . . . , 320-$mn$ of a $m^{th}$ row are coupled in common to a $m^{th}$ selection enable line 301-$m$. Sources of second PMOS transistors PM1-11, . . . , PM1-$m$1 of the unit cell 320-11, . . . , 320-$m$1 of the first column are coupled in common to a first bit line BL1. Sources of the second PMOS transistors PM2-1$n$, . . . , PM2-$mn$ of the unit cells 320-1$n$, . . . , 320-$mn$ of the $n^{th}$ column are coupled in common to the $n^{th}$ bit line BL$n$.

Each of the plurality of switching units 330-1, . . . , 330-$n$ is disposed between the program voltage supply line 302 and each of the bit lines BL1, . . . , BL$n$. The first bit line BL1 is coupled to the program voltage supply line 302 through a first node VN1. A first switching unit 330-1 is disposed between the first node VN1 and the first bit line BL1. As described with reference to FIG. 13, the first switching unit 330-1 may be composed of a first-third PMOS transistor PM3-1. A source and a drain of the first-third PMOS transistor PM3-1 are coupled to the first node VN1 and the first bit line BL1, respectively. Similarly, the $n^{th}$ bit line BL$n$ is coupled to the program voltage supply line 302 through the $n^{th}$ node VN$n$. An $n^{th}$ switching unit 330-$n$ is disposed between the $n^{th}$ node VN$n$ and the $n^{th}$ bit line BL$n$. As described with reference to FIG. 13, the $n^{th}$ switching unit 330-$n$ may be composed of an $n^{th}$-third PMOS transistor PM3-$n$. A source and a drain of the $n^{th}$-third PMOS transistor PM3-$n$ are coupled to the $n^{th}$ node VN$n$ and the $n^{th}$ bit line BL$n$, respectively.

Each of the plurality of OR gates 530-1, . . . , 530-$n$ is coupled to a gate of each of the third PMOS transistors PM3-1, . . . , PM3-$n$. More specifically, a gate of a first-third PMOS transistor PM3-1 is coupled to an output line of a first OR gate 530-1. Similarly, a gate of the $n^{th}$-third PMOS transistor PM3-$n$ is coupled to an output line of an $n^{th}$ OR gate 530-$n$. Input terminals of the first OR gate 530-1 are coupled to a first bit line selection signal line 501-1, which is coupled to the controller 310, and an output line of the comparator 340, respectively. Input terminals of the $n^{th}$ OR gate 530-$n$ are coupled to an $n^{th}$ bit line selection signal line 501-$n$, which is coupled to the controller 310, and an output line of the comparator 340, respectively. The output line of the comparator 340 is coupled in common to input terminals of the OR gates (e.g., the first OR gate 530-1 through the $n^{th}$ OR gate 530-$n$).

The bit line selection unit 540 is disposed between the plurality of bit lines BL1, . . . , BL$n$ and the comparator 340. A configuration of the bit line voltage selection unit 540 is the same as the configuration described with reference to FIG. 18. Accordingly, the bit line selection unit 540 selectively outputs a bit line voltage VBL of a bit line selected from the plurality of bit lines BL1, BL2, . . . , BL$n$. A bit line may be selected based on bit line selection signals BLS1, BLS2, . . . , BLS$n$ input from the plurality of bit line selection signal lines 501-1, . . . , 501-$n$.

In the EPROM device 500 according to an embodiment, in order to perform a program operation or a read operation, a unit cell (hereinafter, referred to as a "selected unit cell") needs to be selected as a program target cell or a read target cell from the unit cells 320-11, . . . , 320-1$n$, . . . , 320-$m$1, . . . , 320-$mn$ constituting the cell array 520. To this end, a row and a column coupled to the selected unit cell need to be selected. The row including the selected unit cell may be selected by selection enable signals SELEN1, . . . , SELEN$m$ generated from the controller 310. For example, when a unit cell 320-11 (hereinafter, referred to as a "selected unit cell") disposed in a first row and a first column is scheduled to be programmed, for the purpose of selecting the first row in which the selected unit cell 320-11 is included, the controller 310 generates a low-level signal as a first selection enable signal SELEN1, and generates high-level signals as the remaining selection enable signals. In this case, the first PMOS transistors PM1-11, . . . , PM1-1$n$ of the unit cells 320-11, . . . , 320-1$n$ of the first row are turned on, whereas the first PMOS transistors of each of the unit cells of the remaining rows are turned off.

In order to select the first column in which the selected unit cell 320-11 is included, the controller 310 generates a low-level signal as a first bit line selection signal BLS1 through a first bit line selection signal line 501-1, and generates high-level signals through the remaining bit line selection signal lines 501-2, . . . , 501-$n$. As a low-level signal is input through the first bit line selection signal line 501-1, the first OR gate 530-1 outputs an output signal at the same level as an output signal of the comparator 340. As a result, the first-third PMOS transistor PM3-1 is turned off when the output signal of the comparator 340 is a high-level signal and is turned on when the comparator 340 is a low-level signal. In addition, as a low-level signal is input through the first bit line selection signal line 501-1, the bit line voltage selecting unit 540 inputs a bit line voltage VBL of the first bit line BL1 to the comparator 340. In this case, the same operation as the program operation for the unit cell 320 of FIG. 13 may be performed on the selected unit cell 320-11 of the cell array 520. On the other hand, as high-level signals are input through the bit line selection signal lines, each of the remaining OR gates 430-2, . . . , 430-n outputs a high-level signal, regardless of the output signal level of the comparator 340. Therefore, each of the remaining third PMOS transistors PM3-2, . . . , PM3-n remains turned off.

Figure 20:
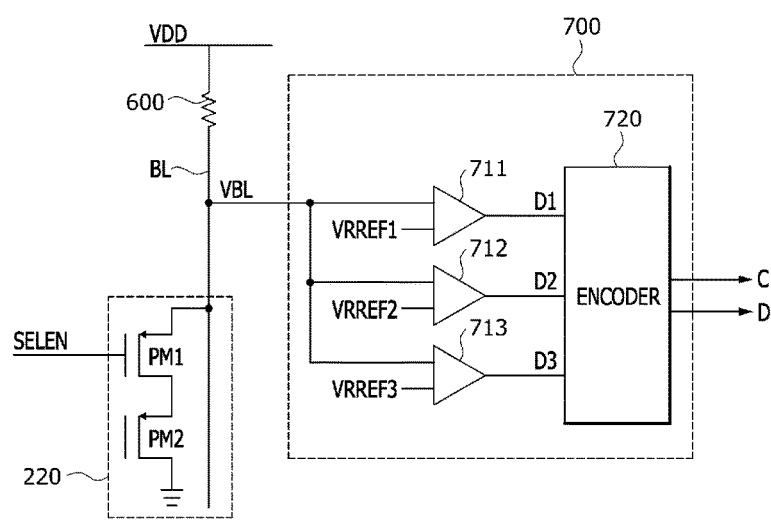
FIG. 20 is a circuit diagram illustrating an example of a read circuit of an EPROM device according to an embodiment of the present disclosure.

FIG. 20 is a circuit diagram illustrating an example of a read circuit 700 of an EPROM device according to an embodiment of the present disclosure. Referring to FIG. 20, the read circuit 700 of the EPROM device is coupled to a bit line BL, which is coupled to a power supply line of a read voltage VDD. A load resistor 600 and a unit cell 220 are coupled to the bit line BL. The unit cell 220 is composed of a first PMOS transistor PM1 and a second PMOS transistor PM2, which are disposed between the bit line BL and a ground voltage terminal in series. The first PMOS transistor PM1 acts as a selecting transistor, and the second PMOS transistor PM2 acts as a cell transistor. The first PMOS transistor PM1 is turned on or turned off depending on a voltage level of a selection enable signal SELEN applied to a gate thereof.

The read circuit 700 may include a first comparator 711, a second comparator 712, a third comparator 713, and an encoder 720. The first comparator 711 receives a bit line voltage VBL and a first read reference voltage VRREF1. The first comparator 711 outputs a low-level signal Low when the bit line voltage VBL is greater than the first read reference voltage VRREF1, and outputs a high-level signal High when the bit line voltage VBL is smaller than the first read reference voltage VRREF1. An output signal of the first comparator 711 constitutes a first input D1 of the encoder 720. The second comparator 712 receives the bit line voltage VBL and a second read reference voltage VRREF2. The second comparator 712 outputs a low-level signal Low when the bit line voltage VBL is greater than the second read reference voltage VRREF2, and outputs a high-level signal High when the bit line voltage VBL is smaller than the second read reference voltage VRREF2. An output signal of the second comparator 712 constitutes a second input D2 of the encoder 720. The third comparator 713 receives the bit line voltage VBL and a third read reference voltage VRREF3. The third comparator 713 outputs a low-level signal Low when the bit line voltage VBL is greater than the third read reference voltage VRREF3, and outputs a high-level signal High when the bit line voltage VBL is smaller than the third read reference voltage VRREF3. The output signal of the third comparator 713 constitutes a third input signal D3 of the encoder 720.

The encoder 720 receives the first input signal D1, the second input signal D2, and the third input signal D3 through a first input terminal, a second input terminal, and a third input terminal, respectively. The first input signal D1 is an output signal of the first comparator 711, the second input signal D2 is an output signal of the second comparator 712, and the third input signal D3 is an output signal of the third comparator 713. The encoder 720 outputs two-bit data consisting of binary data signals C and D according to combinations of signal levels of the input signals D1, D2, and D3. Examples of the two-bit data consisting of binary data signals C and D include "00," "01," "10," and "11."

Figure 21:
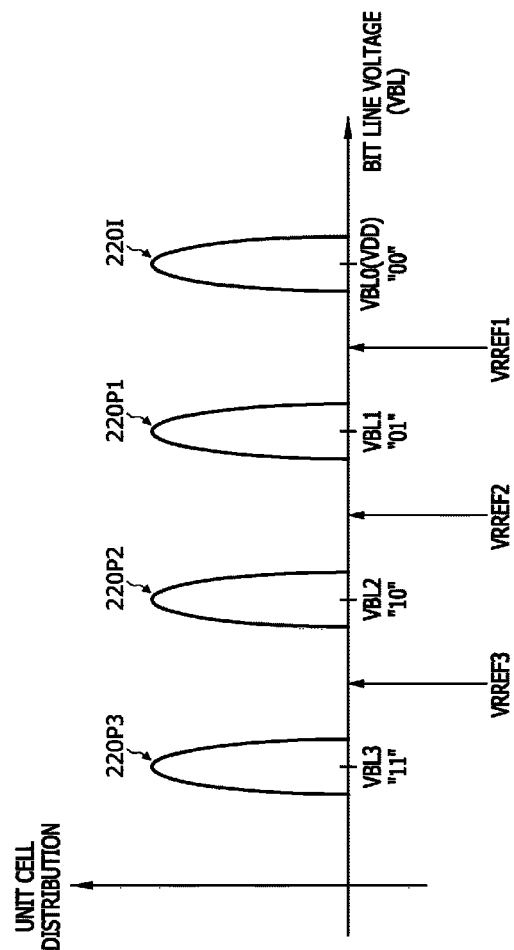
FIG. 21 is a graph illustrating a distribution of unit cells for a bit line voltage to explain an operation of a read circuit of an EPROM device according to an embodiment of the present disclosure.

FIG. 21 is a graph illustrating a unit cell distribution for a bit line voltage to explain an operation of a read circuit of an EPROM device according to an embodiment of the present disclosure. FIG. 22 is a table illustrating output data according to a program mode of a unit cell of an EPROM device according to an embodiment of the present disclosure.

Referring first to FIG. 21, a unit cell 220 may be in an initial state or a programmed state. A program current does not flow through the initial-state unit cell 220, and thus a bit line voltage VBL0 becomes a read supply voltage VDD. In cases of the programmed unit cells 220P1, 220P2, 220P3, an amount of program current flowing through the unit cells varies depending on which program mode the unit cells are programmed in, and therefore the unit cells may have different bit line voltages from each other. For example, in a case of the unit cell 220P1 programmed in a first program mode PM1, a first bit line voltage VBL1 corresponding to the unit cell 220P1 is smaller than the read supply voltage VDD. The unit cell 220P2 programmed in a second program mode PM2 corresponds to a second bit line voltage VBL2 smaller than the first bit line voltage VBL1. And, a third bit line voltage VBL3 corresponding to the unit cell 220P3 programmed in the third program mode PM3 is smaller than the second bit line voltage VBL2. The third bit line voltage VBL3 is greater than a ground voltage (e.g., 0 V in a case of a high program current).

The first read reference voltage VRREF1 input to the first comparator 711 may have a value between the first bit line voltage VBL1 and the read supply voltage VDD. As a result, the first comparator 711 outputs a low-level signal for the unit cell 2201 in an initial state, and outputs high-level signals for the programmed unit cells 220P1, 220P2, 220P3. The second read reference voltage VRREF2 input to the second comparator 712 is set to a value between the second bit line voltage VBL2 and the first bit line voltage VBL1. Accordingly, the second comparator 712 outputs low-level signals for the unit cell 2201 of an initial state and the unit cell 220P1 programmed in the first program mode PM1, and outputs high-level signals for the unit cells 220P2, 220P3 programmed in the second program mode PM2 and the third program mode PM3. The third read reference voltage VRREF3 input to the third comparator 713 is set to a value between the third bit line voltage VBL3 and the second bit line voltage VBL2. Accordingly, the third comparator 713 outputs low-level signals for the unit cell 2201 in an initial state and the unit cells 220P1 and 220P2 programmed in the first program mode PM1 and the second program mode PM2, and outputs a high-level signal for the unit cell 220P3 programmed in the third program mode PM3.

Referring to FIGS. 20, 21, and 22, in a case of the unit cell in a non-program mode PM0, that is, in a case of the unit cell 2201 in an initial state, when turning on the first PMOS transistor PM1 and applying the read supply voltage VDD to the bit line BL, the bit line voltage VBL0 has a value of the read supply voltage VDD. As the bit line voltage VBL0 is greater than the first read reference voltage VRREF1, the second read reference voltage VRREF2, and the third read reference voltage VRREF3, the first comparator 711, the second comparator 712, and the third comparator 713 output low-level signals Low. In other words, the first input signal D1, the second input signal D2, and the third input signal D3 of the encoder 720 are composed of low-level signals Low, and the encoder 720 outputs "00" as a combination of the binary data signals C and D.

In a case of the unit cell 220P1 programmed in a first program mode PM1, when turning on the first PMOS transistor PM1 and applying the read supply voltage VDD to the bit line BL, the first bit line voltage VBL1 corresponding the unit cell 220P1 is smaller than the read supply voltage VDD. The first bit line voltage VBL1 has a value between the first read reference voltage VRREF1 and the second read reference voltage VRREF2. Since the first bit line voltage VBL1 is smaller than the first read reference voltage VRREF1, the first comparator 711 outputs a high-level signal. On the other hand, since the first bit line voltage VBL1 is greater than the second read reference voltage VRREF2 and the third read reference voltage VRREF3, both of the second comparator 712 and the third comparator 713 output low-level signals Low. In other words, the first input signal D1, the second input signal D2, and the third input signal D3 of the encoder 720 are a high-level signal High, a low-level signal Low, and a low-level signal Low, respectively, and the encoder 720 outputs "01" as a combination of the binary data signals C and D.

In a case of the unit cell 220P2 programmed in a second program mode PM2, when turning on the first PMOS transistor PM1 and applying the read supply voltage VDD to the bit line BL, the second bit line voltage VBL2 corresponding to the unit cell 220P2 is smaller than the first bit line voltage VBL1 and greater than the third bit line voltage VBL3. The second bit line voltage VBL2 has a value between the second read reference voltage VRREF2 and the third read reference voltage VRREF3. Since the second bit line voltage VBL2 is smaller than the first read reference voltage VRREF1 and the second read reference voltage VRREF2, the first comparator 711 and the second comparator 712 output high-level signals High. On the other hand, since the first bit line voltage VBL1 is greater than the third read reference voltage VRREF3, the third comparator 713 outputs a low-level signal Low. In other words, the first input signal D1, the second input signal D2, and the third input signal D3 of the encoder 720 are a high-level signal High, a high-level signal High, and a low-level signal Low, respectively, and the encoder 720 outputs "10" as a combination of the binary data signals C and D.

In a case of the unit cell 220P3 programmed in a third program mode PM3, when turning on the first PMOS transistor PM1 and applying the read supply voltage VDD to the bit line BL, the third bit line voltage VBL3 corresponding to the unit cell 220P3 is smaller than the second bit line voltage VBL2. The third bit line voltage VBL3 has a value less than the first read reference voltage VRREF1, the second read reference voltage VRREF2, and the third read reference voltage VRREF3. Accordingly, the first comparator 711, the second comparator 712, and the third comparator 713 output high-level signals High. In other words, the first input signal D1, the second input signal D2, and the third input signal D3 of the encoder 720 are high-level signals High, and the encoder 720 outputs "11" as a combination of the binary data signals C and D.

Figure 23:
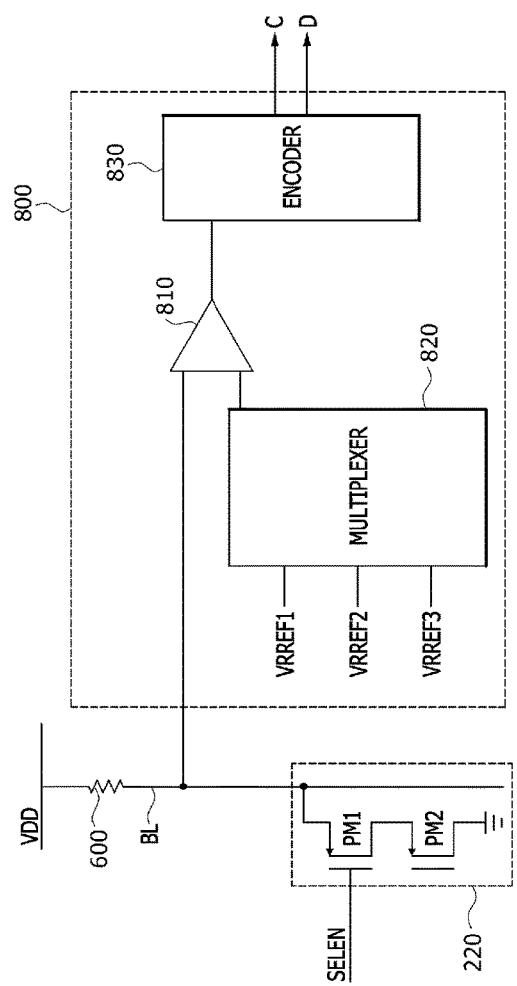
FIG. 23 is a circuit diagram illustrating an example of a read circuit of an EPROM device according to an embodiment of the present disclosure.

FIG. 23 is a circuit diagram illustrating an example of a read circuit 800 of an EPROM device according to an embodiment of the present disclosure. In FIG. 23, the same reference numerals or designators as used in FIG. 20 denote the same elements.

Referring to FIG. 23, the read circuit 800 of an EPROM device is coupled to a bit line BL, which is coupled to a power supply line of a read supply voltage VDD. The read circuit 800 may include a comparator 810, a multiplexer 820, and an encoder 830. The comparator 810 receives a bit line voltage VBL and an output signal of the multiplexer 820. The comparator 810 outputs a low-level signal Low when the bit line voltage VBL is greater than the output signal of the multiplexer 820, and outputs a high-level signal High when the bit line voltage VBL is smaller than the output signal of the multiplexer 820. The output signal of the comparator 810 constitutes an input signal of the encoder 830. The multiplexer 820 receives a first read reference voltage VRREF1, a second read reference voltage VRREF2, and a third read reference voltage VRREF3. Also, the multiplexer 820 sequentially outputs the input first read reference voltage VRREF1, the second read reference voltage VRREF2, and the third read reference voltage VRREF3 to the comparator 810. The multiplexer 820 outputs the second read reference voltage VRREF2 after a predetermined time has passed since the first read reference voltage VRREF1 was output. And, after a predetermined time has passed again, the multiplexer 820 outputs the third read reference voltage VRREF3. As a result, the comparator 810 sequentially receives the first read reference voltage VRREF1, the second read reference voltage VRREF2, and the third read reference voltage VRREF3.

During the bit line voltage VBL and the first read reference voltage VRREF1 are input to the comparator 810, the comparator 810 compares the two voltages and outputs a low-level signal Low when the bit line voltage VBL is greater than the first read reference voltage VRREF1, and outputs a high-level signal High when the bit line voltage VBL is smaller than the first read reference voltage VRREF1. During the bit line voltage VBL and the second read reference voltage VRREF2 are input to the comparator 810, the comparator 810 compares the two voltages and outputs a low-level signal Low when the bit line voltage VBL is greater than the second read reference voltage VRREF2, and outputs a high-level signal High when the bit line voltage VBL is smaller than the second read reference voltage VRREF2. During the bit line voltage VBL and the third read reference voltage VRREF3 are input to the comparator 810, the comparator 810 compares the two voltages and outputs a low-level signal Low when the bit line voltage VBL is greater than the third read reference voltage VRREF3, and outputs a high-level signal High when the bit line voltage VBL is smaller than the third read reference voltage VRREF3.

The encoder 830 combines the output signals of the comparator 810, which are input sequentially, and outputs binary data C, D. As described with reference to FIGS. 21 and 22, in a case of the unit cell 2201 at an initial state, three of low-level signals Low are sequentially input to the encoder 830, and the encoder 830 outputs "00"" as a combination of the binary data signals C and D. In a case of the unit cell 220P1 programmed in a first program mode PM1, a high-level signal High, a low-level signal Low, and a low-level signal Low are sequentially input to the encoder 830, and the encoder 830 outputs "01"" as a combination of the binary data signals C and D. In a case of the unit cell 220P2 programmed in a second program mode PM2, a high-level signal High, a high-level signal High, and a low-level signal Low are sequentially input to the encoder 830, and the encoder 830 outputs "10"" as a combination of the binary data signals C and D. In a case of the unit cell 220P3 programmed in a third program mode PM3, three of high-level signals High are sequentially input to the encoder 830, and the encoder 830 outputs "11"" as a combination of the binary data signals C and D.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. An EPROM device comprising:
a unit cell disposed between a bit line, which is coupled to a program voltage supply line, and a ground voltage terminal;
a switching unit disposed between the bit line and the program voltage supply line and controlling an electrical coupling between the program voltage supply line and the unit cell according to a switching control signal;
a decoder configured to generate a plurality of output signals according to an input of binary data;
a comparing unit configured to be enabled by some of output signals of the decoder, the comparing unit comparing each of a plurality of reference voltages with the bit line voltage and generating a program mode output signal; and
a level shifter configured to receive at least one output signal among the output signals of the decoder and the program mode output signal, the level shifter outputting the output signal of the decoder or the program mode output signal as the switching control signal.

2. The EPROM device of claim 1, wherein the unit cell includes a selecting transistor and a cell transistor, which are disposed in series between the bit line and the ground voltage terminal.

3. The EPROM device of claim 2, wherein:
the selecting transistor includes a first PMOS transistor having a gate coupled to a selection enable signal line, a source coupled to the bit line, and a drain; and
the cell transistor includes a second PMOS transistor having a gate of a floating state, a drain coupled to the ground voltage terminal, and a source coupled to the drain of the first PMOS transistor.

4. The EPROM device of claim 1, wherein the switching unit includes a third PMOS transistor having a gate to which a switching control signal of the level shifter is applied, a source coupled to the program voltage supply line, and a drain coupled to the bit line.

5. The EPROM device of claim 4, wherein the decoder inputs an output signal at a high level to the level shifter, and inputs a first output signal, a second output signal, and a third output signal at low levels to the comparing unit in a non-program mode.

6. The EPROM device of claim 5, wherein:
the decoder inputs an output signal at a low level to the level shifter in a first program mode, a second program mode, and a third program mode;
the decoder inputs a first output signal at a high level, a second output signal at a low level, and a third output signal at a low level to the comparing unit in the first program mode;
the decoder inputs a first output signal at a low level, a second output signal at a high level, and a third output signal at a low level to the comparing unit in the second program mode; and
the decoder inputs a first output signal at a low level, a second output signal at a low level, and a third output signal at a high level to the comparing unit in the third program mode.

7. The EPROM device of claim 6, wherein the comparing unit comprises:
a first comparator configured to be enabled by the first output signal at a high level to generate the program mode output signal according to a comparing result obtained by comparing a first reference voltage with the bit line voltage;
a second comparator configured to be enabled by the second output signal at a high level to generate the program mode output signal according to a comparing result obtained by comparing a second reference voltage with the bit line voltage; and
a third comparator configured to be enabled by the third output signal at a high level to generate the program mode output signal according to a comparing result obtained by comparing a third reference voltage with the bit line voltage.

8. The EPROM device of claim 7, wherein the first reference voltage has a value less than a program voltage, the second reference voltage has a value less than the first reference voltage, and the third reference voltage has a value less than the second reference voltage.

9. The EPROM device of claim 8, wherein:
the first comparator outputs a program mode output signal at a low level until the bit line voltage reaches the first reference voltage, and outputs a program mode output signal at a high level when the bit line voltage reaches the first reference voltage;
the second comparator outputs a program mode output signal at a low level until the bit line voltage reaches the second reference voltage, and outputs a program mode output signal at a high level when the bit line voltage reaches the second reference voltage; and
the third comparator outputs a program mode output signal at a low level until the bit line voltage reaches the third reference voltage, and outputs a program mode output signal at a high level when the bit line voltage reaches the third reference voltage.

10. The EPROM device of claim 9, wherein the level shifter outputs a switching control signal at a high level when an output signal at a high level is input from the decoder, and outputs a switching control signal at the same level as the program mode output signal output from the comparing unit when an output single at a low level is input from the decoder.

11. The EPROM device of claim 10, wherein:
the level shifter outputs an output signal of the decoder at a high level as a switching control signal in the non-program mode;
the level shifter outputs a switching control signal at the same level as the program mode output signal of the first comparator in the first program mode;
the level shifter outputs a switching control signal at the same level as the program mode output signal of the second comparator in the second program mode; and
the level shifter outputs a switching control signal at the same level as the program mode output signal of the third comparator in the third program mode.

12. An EPROM device comprising:
a cell array configured to include unit cells that are disposed at an intersection of a plurality of bit lines and a plurality of selection enable signal lines, the a plurality of bit lines being coupled to a program voltage supply line and constituting columns, the plurality of selection enable signal lines constituting rows;
a controller configured to output selection enable signals, binary data, and bit line selection signals, selection enable signals being used for selecting, among the rows, a row in which a selected unit cell is included, the binary data being determined according to a program mode, the bit line selection signals being used for selecting, among the columns, a column in which the selected unit cell is included;

a switching unit disposed between the program voltage supply line and each of the bit lines, the switching unit controlling an electrical coupling between the program voltage supply line and the unit cells coupled to each of the bit lines according to the switching control signal;

a decoder configured to generate a plurality of output signals according to an input of the binary data;

a comparing unit configured to be enabled by the output signals of the decoder, the comparing unit comparing each of the plurality of reference voltages and the bit line voltage and generating a program mode output signal;

a level shifter configured to receive at least one output signal among the output signals of the decoder and the program mode output signal, and output the output signal of the decoder or the program mode output signal;

an OR gate disposed between the switching unit and the level shifter, the OR gate receiving one of the bit line selection signals and an output signal of the level shifter and generating the switching control signal; and a bit line voltage selection unit configured to receive the bit line voltages of the bit lines, output, among the bit line voltages, a bit line voltage of the selected bit line in response to the bit line selection signals, and input the bit line voltage to the comparing unit.

13. The EPROM device of claim 12, wherein each of the unit cells includes a selecting transistor and a cell transistor, which are disposed in series between the bit line and a ground voltage terminal.

14. The EPROM device of claim 13, wherein:
the selecting transistor includes a first PMOS transistor having a gate coupled to the selection enable signal line, a source coupled to the bit line, and a drain; and
the cell transistor includes a second PMOS transistor having a gate of a floating state, a drain coupled to the ground voltage terminal, and a source coupled to the drain of the first PMOS transistor.

15. The EPROM device of claim 14, wherein:
sources of the first PMOS transistors of the unit cells constituting an $n^{th}$ column are coupled in common to an $n^{th}$ bit line; and
an $m^{th}$ selection enable signal is applied in common to gates of the PMOS transistors of the unit cells constituting an $m^{th}$ row.

16. The EPROM device of claim 15, wherein the switching unit includes a third PMOS transistor having a gate to which the switching control signal of the OR gate is applied, a source coupled to the program voltage supply line, and a drain coupled to the bit line.

17. The EPROM device of claim 16, wherein the decoder inputs an output signal at a high level to the level shifter and outputs a first output signal, a second output signal, and a third output signal at low levels to the comparing unit in a non-program mode.

18. The EPROM device of claim 17, wherein:
the decoder inputs an output signal at a low level to the level shifter in a first program mode, a second program mode, and a third program mode;
the decoder inputs a first output signal at a high level, a second output signal at a low level, and a third output signal at a low level to the comparing unit in the first program mode;

the decoder inputs a first output signal at a low level, a second output signal at a high level, and a third output signal at a low level to the comparing unit in the second program mode; and the decoder inputs a first output signal at a low level, a second output signal at a low level, and a third output signal at a high level to the comparing unit in the third program mode.

19. The EPROM device of claim 18, wherein the comparing unit comprises:
a first comparator configured to be enabled by the first output signal at a high level, the first comparator generating the program mode output signal according to a comparing result obtained by comparing a first reference voltage with the bit line voltage;
a second comparator configured to be enabled by the second output signal at a high level to generate the program mode output signal according to a comparing result obtained by comparing a second reference voltage with the bit line voltage; and
a third comparator configured to be enabled by the third output signal at a high level to generate the program mode output signal according to a comparing result obtained by comparing a third reference voltage with the bit line voltage.

20. The EPROM device of claim 19, wherein the first reference voltage has a value less than a program voltage, the second reference voltage has a value less than the first reference voltage, and the third reference voltage has a value less than the second reference voltage.

21. The EPROM device of claim 20, wherein:
the first comparator outputs a program mode output signal at a low level until the bit line voltage reaches the first reference voltage, and outputs a program mode output signal at a high level when the bit line voltage reaches the first reference voltage;
the second comparator outputs a program mode output signal at a low level until the bit line voltage reaches the second reference voltage, and outputs a program mode output signal at a high level when the bit line voltage reaches the second reference voltage; and
the third comparator outputs a program mode output signal at a low level until the bit line voltage reaches the third reference voltage, and outputs a program mode output signal at a high level when the bit line voltage reaches the third reference voltage.

22. The EPROM device of claim 21, wherein the level shifter outputs an output signal at a high level when an output signal at a high level is input from the decoder, and outputs an output signal at the same level as the program mode output signal output from the comparing unit when an output single at a low level is input from the decoder.

23. The EPROM device of claim 21, wherein:
the level shifter outputs an output signal of the decoder at a high level in the non-program mode;
the level shifter outputs an output signal at the same level as the program mode output signal of the first comparator in the first program mode;
the level shifter outputs an output signal at the same level as the program mode output signal of the second comparator in the second program mode; and
the level shifter outputs an output signal at the same level as the program mode output signal of the third comparator in the third program mode.

* * * * *